United States Patent
Wade

(10) Patent No.: US 10,753,982 B2
(45) Date of Patent: Aug. 25, 2020

(54) MONITORING BATTERY HEALTH OF A BATTERY USED IN A DEVICE

(71) Applicant: Square, Inc., San Francisco, CA (US)

(72) Inventor: Jeremy Wade, San Francisco, CA (US)

(73) Assignee: Square, Inc., San Francisco, CA (US)

( * ) Notice: Subject to any disclaimer, the term of this patent is extended or adjusted under 35 U.S.C. 154(b) by 508 days.

(21) Appl. No.: 14/565,277

(22) Filed: Dec. 9, 2014

(65) Prior Publication Data

US 2016/0161565 A1 Jun. 9, 2016

(51) Int. Cl.
*G01R 31/389* (2019.01)
*G01R 31/392* (2019.01)
*G01R 31/3835* (2019.01)

(52) U.S. Cl.
CPC ....... *G01R 31/389* (2019.01); *G01R 31/3835* (2019.01); *G01R 31/392* (2019.01)

(58) Field of Classification Search
CPC .............. G01R 31/3606; G01R 31/362; G01R 32/3631; G01R 31/3637; G01R 31/3662; G01R 31/3679; G01R 31/392; G01R 31/389; G01R 31/3835; H01M 2010/4271
USPC .......................................................... 702/63
See application file for complete search history.

(56) References Cited

U.S. PATENT DOCUMENTS

| 3,128,349 | A | 4/1964 | Boesch et al. |
| D284,446 | S | 7/1986 | Rosenblad |
| 4,776,003 | A | 10/1988 | Harris |
| 4,860,336 | A | 8/1989 | D'Avello et al. |
| 5,221,838 | A | 6/1993 | Gutman et al. |
| 5,351,296 | A | 9/1994 | Sullivan |
| 5,388,155 | A | 2/1995 | Smith |
| 5,408,513 | A | 4/1995 | Busch, Jr. et al. |
| 5,434,395 | A | 7/1995 | Storck et al. |

(Continued)

FOREIGN PATENT DOCUMENTS

| AU | 2324402 A | 6/2002 |
| CA | 152789 S | 9/2014 |

(Continued)

OTHER PUBLICATIONS

International Search Report and Written Opinion for PCT Application No. PCT /US2015/064524 dated Feb. 19, 2016.

(Continued)

*Primary Examiner* — Alfredo Bermudez Lozada
(74) *Attorney, Agent, or Firm* — Polsinelli, PC

(57) ABSTRACT

Approaches provide for determining an internal rate of resistance of a battery in a computing device. In particular, various examples enable using a processor to expose the battery to a first load at a first rate of consumption and to measure a first analog voltage across the battery during exposure of the battery to the first load. The processor is able to expose the battery to a second load a second rate of consumption and to measure a second analog voltage across the battery during exposure of the battery to the second load. Linear equations can be used to solve for the battery's internal rate of resistance based at least in part on the first rate of consumption, the first analog voltage, the second rate of consumption, and the second analog voltage. In various embodiments, the battery's internal rate of resistance can be correlated to a battery health indicator.

17 Claims, 8 Drawing Sheets

(56) References Cited

U.S. PATENT DOCUMENTS

| | | |
|---|---|---|
| 5,485,073 A | 1/1996 | Kasashima et al. |
| 5,553,294 A | 9/1996 | Nanno et al. |
| 5,679,943 A | 10/1997 | Schultz et al. |
| 5,714,741 A | 2/1998 | Pieterse et al. |
| 5,729,591 A | 3/1998 | Bailey |
| 5,740,232 A | 4/1998 | Pailles et al. |
| 5,763,862 A | 6/1998 | Jachimowicz et al. |
| 5,781,013 A | 7/1998 | Takahashi |
| 5,835,366 A | 11/1998 | Pleso et al. |
| 5,838,773 A | 11/1998 | Eisner et al. |
| 5,850,599 A | 12/1998 | Seiderman |
| 5,867,795 A | 2/1999 | Novis et al. |
| 5,933,498 A | 8/1999 | Schneck et al. |
| 5,940,510 A | 8/1999 | Curry et al. |
| 5,945,654 A | 8/1999 | Huang |
| 5,949,047 A | 9/1999 | Abe et al. |
| D417,442 S | 12/1999 | Butts et al. |
| 6,010,067 A | 1/2000 | Elbaum |
| 6,098,881 A | 8/2000 | Deland, Jr. et al. |
| 6,144,336 A | 11/2000 | Preston et al. |
| 6,150,823 A * | 11/2000 | Takahashi ......... G01R 31/3648 324/427 |
| 6,213,392 B1 | 4/2001 | Zuppicich |
| 6,230,267 B1 | 5/2001 | Richards et al. |
| 6,234,389 B1 | 5/2001 | Valliani et al. |
| 6,278,779 B1 | 8/2001 | Bryant et al. |
| 6,355,892 B1 | 3/2002 | Marks |
| 6,481,623 B1 | 11/2002 | Grant et al. |
| 6,497,368 B1 | 12/2002 | Friend et al. |
| D477,321 S | 7/2003 | Baughman |
| 6,698,654 B1 | 3/2004 | Zuppicich |
| 6,763,399 B2 | 7/2004 | Margalit et al. |
| 6,871,278 B1 | 3/2005 | Sciupac |
| 6,886,742 B2 | 5/2005 | Stoutenburg et al. |
| 6,945,454 B2 | 9/2005 | Tournemille et al. |
| 6,990,683 B2 | 1/2006 | Itabashi |
| 7,003,316 B1 | 2/2006 | Elias et al. |
| 7,066,382 B2 | 6/2006 | Kaplan |
| 7,083,090 B2 | 8/2006 | Zuili |
| 7,163,148 B2 | 1/2007 | Durbin et al. |
| 7,210,627 B2 | 5/2007 | Morley et al. |
| D553,459 S | 10/2007 | Shor |
| 7,357,309 B2 | 4/2008 | Ghosh et al. |
| 7,363,054 B2 | 4/2008 | Elias et al. |
| D568,130 S | 5/2008 | Arns |
| D575,056 S | 8/2008 | Tan |
| 7,424,732 B2 | 9/2008 | Matsumoto et al. |
| 7,433,452 B2 | 10/2008 | Taylor et al. |
| D590,828 S | 4/2009 | Sherrod et al. |
| D600,085 S | 9/2009 | Mandel et al. |
| 7,587,756 B2 | 9/2009 | Peart et al. |
| 7,591,425 B1 | 9/2009 | Zuili et al. |
| D607,000 S | 12/2009 | Cheng et al. |
| 7,668,308 B1 | 2/2010 | Wurtz |
| 7,673,799 B2 | 3/2010 | Hart et al. |
| D620,330 S | 7/2010 | Krumpe et al. |
| D624,912 S | 10/2010 | Chen et al. |
| 7,810,729 B2 | 10/2010 | Morley, Jr. |
| D630,073 S | 1/2011 | Krumpe et al. |
| 7,874,483 B2 | 1/2011 | Wang et al. |
| D646,264 S | 10/2011 | Dong |
| 8,086,531 B2 | 12/2011 | Litster et al. |
| D653,664 S | 2/2012 | Turnbull et al. |
| 8,117,453 B2 | 2/2012 | Huque |
| 8,126,734 B2 | 2/2012 | Dicks et al. |
| D655,588 S | 3/2012 | Pennington et al. |
| 8,132,670 B1 | 3/2012 | Chen |
| 8,181,871 B2 | 5/2012 | Wang et al. |
| 8,265,553 B2 | 9/2012 | Cheon et al. |
| D668,125 S | 10/2012 | Pennington et al. |
| 8,281,998 B2 | 10/2012 | Tang et al. |
| 8,297,507 B2 | 10/2012 | Kayani |
| 8,336,771 B2 | 12/2012 | Tsai et al. |
| D675,618 S | 2/2013 | Behar et al. |
| D677,667 S | 3/2013 | Smith et al. |
| 8,397,103 B2 | 3/2013 | Baba |
| 8,397,988 B1 | 3/2013 | Zuili |
| D679,714 S | 4/2013 | Smith et al. |
| D680,537 S | 4/2013 | Miller et al. |
| 8,452,004 B2 | 5/2013 | Lee |
| D686,208 S | 7/2013 | Miller et al. |
| 8,500,018 B2 | 8/2013 | McKelvey et al. |
| D689,753 S | 9/2013 | Yoo et al. |
| 8,573,486 B2 | 11/2013 | McKelvey et al. |
| 8,573,487 B2 | 11/2013 | McKelvey |
| 8,584,945 B2 | 11/2013 | Wang et al. |
| D700,606 S | 3/2014 | Lo |
| D703,211 S | 4/2014 | Weller et al. |
| D706,266 S | 6/2014 | Rotsaert |
| 8,740,072 B1 | 6/2014 | Dorogusker |
| 8,751,039 B1 | 6/2014 | Macoviak et al. |
| D711,876 S | 8/2014 | McWilliam et al. |
| 8,807,431 B2 | 8/2014 | Wang et al. |
| D712,892 S | 9/2014 | Hong et al. |
| 8,840,017 B2 | 9/2014 | Chan et al. |
| 8,840,024 B2 | 9/2014 | McKelvey et al. |
| 8,875,990 B2 | 11/2014 | Bishop et al. |
| D724,094 S | 3/2015 | Blochinger et al. |
| D725,655 S | 3/2015 | Debaigue et al. |
| 8,983,873 B2 | 3/2015 | Lund |
| D726,171 S | 4/2015 | Edwards |
| 9,016,570 B1 | 4/2015 | Gluck |
| 9,020,853 B2 | 4/2015 | Hoffman et al. |
| D728,549 S | 5/2015 | Su et al. |
| D728,568 S | 5/2015 | Debaigue et al. |
| D731,493 S | 6/2015 | Mills |
| 9,063,737 B2 | 6/2015 | Babu et al. |
| 9,123,036 B2 | 9/2015 | Graylin et al. |
| D740,285 S | 10/2015 | Templeton |
| D740,286 S | 10/2015 | Templeton |
| D740,820 S | 10/2015 | Templeton et al. |
| 9,256,770 B1 | 2/2016 | Edwards |
| 9,355,285 B1 | 5/2016 | Wade et al. |
| D762,651 S | 8/2016 | Edwards et al. |
| D766,238 S | 9/2016 | Nguyen |
| D766,901 S | 9/2016 | Nguyen |
| D774,510 S | 12/2016 | Rotsaert |
| D776,658 S | 1/2017 | Zhu et al. |
| 9,576,159 B1 | 2/2017 | Templeton et al. |
| D780,731 S | 3/2017 | Kim et al. |
| 9,607,298 B2 | 3/2017 | Brudnicki et al. |
| 9,659,195 B2 | 5/2017 | Wade et al. |
| 9,665,867 B2 | 5/2017 | Guise et al. |
| 9,667,426 B2 | 5/2017 | Sekiya et al. |
| 9,679,286 B2 | 6/2017 | Colnot et al. |
| D795,869 S | 8/2017 | Templeton |
| 9,736,144 B2 | 8/2017 | McCanna et al. |
| 9,740,849 B2 | 8/2017 | Etchegoyen et al. |
| 9,760,740 B1 | 9/2017 | Edwards |
| 9,760,962 B2 | 9/2017 | Lese |
| 9,769,134 B2 | 9/2017 | Dominguez et al. |
| 9,788,205 B2 | 10/2017 | Sarmah et al. |
| 9,836,594 B2 | 12/2017 | Zhang et al. |
| 9,836,601 B2 | 12/2017 | Pulapaka et al. |
| 9,852,412 B1 | 12/2017 | Post et al. |
| 9,870,491 B1 | 1/2018 | Wade |
| 10,475,024 B1 | 11/2019 | Behren et al. |
| 10,579,836 B1 | 3/2020 | Edwards |
| 2002/0084771 A1 | 7/2002 | Lundberg |
| 2002/0091633 A1 | 7/2002 | Proctor |
| 2002/0153414 A1 | 10/2002 | Stoutenburg et al. |
| 2003/0135418 A1 | 7/2003 | Shekhar et al. |
| 2003/0154414 A1 | 8/2003 | von Mueller et al. |
| 2003/0183691 A1 | 10/2003 | Lahteenmaki et al. |
| 2004/0012875 A1 | 1/2004 | Wood |
| 2004/0041911 A1 | 3/2004 | Odagiri et al. |
| 2004/0059682 A1 | 3/2004 | Hasumi et al. |
| 2004/0151026 A1 | 8/2004 | Naso et al. |
| 2004/0167820 A1 | 8/2004 | Melick et al. |
| 2004/0178326 A1 | 9/2004 | Hamilton et al. |
| 2004/0204082 A1 | 10/2004 | Abeyta |
| 2004/0251907 A1 | 12/2004 | Kalley |
| 2005/0023348 A1 | 2/2005 | Lucas et al. |
| 2005/0097015 A1 | 5/2005 | Wilkes et al. |

(56) References Cited

U.S. PATENT DOCUMENTS

| | | |
|---|---|---|
| 2005/0109841 A1 | 5/2005 | Ryan et al. |
| 2005/0164631 A1 | 7/2005 | Jin |
| 2005/0236480 A1 | 10/2005 | Vrotsos et al. |
| 2005/0242171 A1 | 11/2005 | Smets et al. |
| 2006/0032905 A1 | 2/2006 | Bear et al. |
| 2006/0049255 A1 | 3/2006 | von Mueller et al. |
| 2006/0095551 A1 | 5/2006 | Leung et al. |
| 2006/0219776 A1 | 10/2006 | Finn |
| 2006/0223580 A1 | 10/2006 | Antonio et al. |
| 2006/0255128 A1 | 11/2006 | Johnson et al. |
| 2007/0063048 A1 | 3/2007 | Havens et al. |
| 2007/0067833 A1 | 3/2007 | Colnot |
| 2007/0118736 A1 | 5/2007 | Huque |
| 2007/0168300 A1 | 7/2007 | Quesselaire et al. |
| 2007/0194104 A1 | 8/2007 | Fukuda et al. |
| 2007/0198436 A1 | 8/2007 | Weiss |
| 2007/0241182 A1 | 10/2007 | Buer |
| 2007/0255643 A1 | 11/2007 | Capuano et al. |
| 2007/0276765 A1 | 11/2007 | Hazel et al. |
| 2007/0285056 A1 | 12/2007 | Yoon et al. |
| 2008/0011850 A1 | 1/2008 | Henry |
| 2008/0091617 A1 | 4/2008 | Hazel et al. |
| 2008/0094069 A1* | 4/2008 | Huang .............. G01R 31/389 324/430 |
| 2008/0123862 A1 | 5/2008 | Rowley |
| 2008/0159543 A1 | 7/2008 | Frisch et al. |
| 2008/0301056 A1 | 12/2008 | Weller et al. |
| 2009/0070583 A1 | 3/2009 | von Mueller et al. |
| 2009/0103725 A1 | 4/2009 | Tang et al. |
| 2009/0112768 A1 | 4/2009 | Hammad et al. |
| 2009/0128090 A1 | 5/2009 | Bi |
| 2009/0144202 A1 | 6/2009 | Hurry |
| 2009/0150294 A1 | 6/2009 | March et al. |
| 2009/0164326 A1 | 6/2009 | Bishop et al. |
| 2009/0198618 A1 | 8/2009 | Chan et al. |
| 2009/0224771 A1* | 9/2009 | Deveau ............ G01R 31/3658 324/600 |
| 2009/0261166 A1 | 10/2009 | Lawson et al. |
| 2009/0284877 A1 | 11/2009 | Heravi et al. |
| 2009/0302806 A1 | 12/2009 | Lindlar et al. |
| 2010/0057620 A1 | 3/2010 | Li et al. |
| 2010/0128449 A1 | 5/2010 | Mangaroo |
| 2010/0138666 A1 | 6/2010 | Adams et al. |
| 2010/0243732 A1 | 9/2010 | Wallner |
| 2010/0289390 A1 | 11/2010 | Kenney |
| 2010/0314446 A1 | 12/2010 | Morley, Jr. |
| 2011/0078081 A1 | 3/2011 | Pirzadeh et al. |
| 2011/0121654 A1 | 5/2011 | Recker et al. |
| 2011/0253788 A1 | 10/2011 | Campbell et al. |
| 2011/0307733 A1 | 12/2011 | Tokunaga |
| 2011/0309145 A1 | 12/2011 | Richardson et al. |
| 2012/0005039 A1 | 1/2012 | Dorsey et al. |
| 2012/0005096 A1 | 1/2012 | Dorsey et al. |
| 2012/0011071 A1 | 1/2012 | Pennock et al. |
| 2012/0032681 A1 | 2/2012 | Fink |
| 2012/0051554 A1 | 3/2012 | Modi et al. |
| 2012/0052910 A1 | 3/2012 | Mu et al. |
| 2012/0091200 A1 | 4/2012 | McKelvey et al. |
| 2012/0091201 A1 | 4/2012 | Babu et al. |
| 2012/0095868 A1 | 4/2012 | McKelvey |
| 2012/0095869 A1 | 4/2012 | McKelvey |
| 2012/0095870 A1 | 4/2012 | McKelvey |
| 2012/0095871 A1 | 4/2012 | Dorsey et al. |
| 2012/0095906 A1 | 4/2012 | Dorsey et al. |
| 2012/0095907 A1 | 4/2012 | Dorsey et al. |
| 2012/0095915 A1 | 4/2012 | McKelvey |
| 2012/0095916 A1 | 4/2012 | Dorsey et al. |
| 2012/0097739 A1 | 4/2012 | Babu et al. |
| 2012/0097740 A1 | 4/2012 | Lamba et al. |
| 2012/0103138 A1 | 5/2012 | Welham et al. |
| 2012/0118956 A1 | 5/2012 | Lamba et al. |
| 2012/0118959 A1 | 5/2012 | Sather et al. |
| 2012/0118960 A1 | 5/2012 | Sather et al. |
| 2012/0126005 A1 | 5/2012 | Dorsey et al. |
| 2012/0126006 A1 | 5/2012 | Dorsey et al. |
| 2012/0126007 A1 | 5/2012 | Lamba et al. |
| 2012/0126010 A1 | 5/2012 | Babu et al. |
| 2012/0126011 A1* | 5/2012 | Lamba .............. G06Q 20/322 235/449 |
| 2012/0126012 A1 | 5/2012 | Lamba et al. |
| 2012/0126013 A1 | 5/2012 | Sather et al. |
| 2012/0126014 A1 | 5/2012 | Sather et al. |
| 2012/0130903 A1 | 5/2012 | Dorsey et al. |
| 2012/0132712 A1 | 5/2012 | Babu et al. |
| 2012/0138683 A1 | 6/2012 | Sather et al. |
| 2012/0168505 A1 | 7/2012 | Sather et al. |
| 2012/0210325 A1* | 8/2012 | de Lind Van Wijngaarden .......... H04W 52/0258 718/103 |
| 2012/0211558 A1 | 8/2012 | Buer |
| 2012/0234918 A1 | 9/2012 | Lindsay |
| 2012/0270528 A1 | 10/2012 | Goodman |
| 2012/0305645 A1 | 12/2012 | Morley, Jr. |
| 2012/0323512 A1 | 12/2012 | Rhodin |
| 2013/0021046 A1 | 1/2013 | Prentice et al. |
| 2013/0024372 A1 | 1/2013 | Spodak et al. |
| 2013/0030997 A1 | 1/2013 | Spodak et al. |
| 2013/0077229 A1* | 3/2013 | Tsai .................. G06K 7/0004 361/679.31 |
| 2013/0087614 A1 | 4/2013 | Limtao et al. |
| 2013/0130743 A1 | 5/2013 | Lin |
| 2013/0140899 A1 | 6/2013 | Tuukkanen et al. |
| 2013/0144792 A1 | 6/2013 | Nilsson et al. |
| 2013/0185559 A1 | 7/2013 | Morel et al. |
| 2013/0211929 A1 | 8/2013 | Itwaru |
| 2013/0289908 A1* | 10/2013 | Nonoyama ........ G01R 31/3842 702/63 |
| 2013/0290762 A1 | 10/2013 | Pawar |
| 2013/0303277 A1* | 11/2013 | Shigeta ................ A63F 1/06 463/30 |
| 2013/0313903 A1 | 11/2013 | Kayama |
| 2014/0089205 A1 | 3/2014 | Kapur et al. |
| 2014/0097242 A1 | 4/2014 | McKelvey |
| 2014/0120866 A1 | 5/2014 | Furtney |
| 2014/0124576 A1 | 5/2014 | Zhou et al. |
| 2014/0167503 A1 | 6/2014 | Redpath et al. |
| 2014/0203082 A1 | 7/2014 | Huh |
| 2014/0258132 A1 | 9/2014 | Swamy et al. |
| 2014/0295761 A1 | 10/2014 | Lo |
| 2014/0297539 A1 | 10/2014 | Swamy et al. |
| 2014/0312691 A1 | 10/2014 | Doljack et al. |
| 2015/0025822 A1* | 1/2015 | Ladret ............... G01R 31/3675 702/63 |
| 2015/0058654 A1* | 2/2015 | Ukai ..................... G06F 1/26 713/340 |
| 2015/0078560 A1 | 3/2015 | Ilango et al. |
| 2015/0132624 A1* | 5/2015 | Nagato ............. G01R 31/3662 429/92 |
| 2016/0034881 A1 | 2/2016 | Post et al. |
| 2016/0275478 A1 | 9/2016 | Li et al. |

FOREIGN PATENT DOCUMENTS

| | | |
|---|---|---|
| CA | 2 920 589 A1 | 8/2016 |
| CN | 302341093 S | 3/2013 |
| CN | 302526592 S | 8/2013 |
| DE | 20320080 U1 | 4/2004 |
| EP | 0 895 203 A2 | 2/1999 |
| EP | 1 874 014 A2 | 1/2008 |
| EP | 1 895 312 A1 | 3/2008 |
| EP | 2 693 298 A2 | 2/2014 |
| EP | 3 091 474 A1 | 11/2016 |
| FR | 2 812 744 A1 | 2/2002 |
| FR | 2 812 745 A1 | 2/2002 |
| FR | 2 834 156 A1 | 6/2003 |
| JP | H09231285 A | 9/1997 |
| JP | 2000-030146 A | 1/2000 |
| JP | 2000-276539 A | 10/2000 |
| JP | 2001-222595 A | 8/2001 |
| JP | 2002-074507 A | 3/2002 |
| JP | 2002-123771 A | 4/2002 |
| JP | 2002-279320 A | 9/2002 |
| JP | 2002-352166 A | 12/2002 |

(56) References Cited

FOREIGN PATENT DOCUMENTS

| | | | |
|---|---|---|---|
| JP | 2002-358285 | A | 12/2002 |
| JP | 2003-108777 | A | 4/2003 |
| JP | 2003-281453 | A | 10/2003 |
| JP | 2003-308438 | A | 10/2003 |
| JP | 2004-054651 | A | 2/2004 |
| JP | 2004-062733 | A | 2/2004 |
| JP | 2004-078553 | A | 3/2004 |
| JP | 2004-078662 | A | 3/2004 |
| JP | 2004-199405 | A | 7/2004 |
| JP | 4248820 | B2 | 4/2009 |
| KR | 10-1999-0066397 | A | 8/1999 |
| KR | 10-1999-0068618 | A | 9/1999 |
| KR | 200225019 | B1 | 3/2001 |
| KR | 10-2003-0005936 | A | 1/2003 |
| KR | 10-2003-0005984 | A | 1/2003 |
| KR | 10-2003-0012910 | A | 2/2003 |
| KR | 200333809 | B1 | 11/2003 |
| KR | 10-2004-0016548 | A | 2/2004 |
| KR | 100447431 | B1 | 8/2004 |
| KR | 200405877 | B1 | 1/2006 |
| KR | 100649151 | B1 | 11/2006 |
| KR | 10-2007-0107990 | A | 11/2007 |
| KR | 100842484 | B1 | 6/2008 |
| RU | 2284578 | C1 | 9/2006 |
| WO | 1998/012674 | A2 | 3/1998 |
| WO | 2000/011624 | A1 | 3/2000 |
| WO | 2000/025277 | A1 | 5/2000 |
| WO | 2001/086599 | A2 | 11/2001 |
| WO | 2002/033669 | A1 | 4/2002 |
| WO | 2002/043020 | A2 | 5/2002 |
| WO | 2002/082388 | A1 | 10/2002 |
| WO | 2002/084548 | A1 | 10/2002 |
| WO | 2003/044710 | A1 | 5/2003 |
| WO | 2003/079259 | A1 | 9/2003 |
| WO | 2004/023366 | A1 | 3/2004 |
| WO | 2006/131708 | A1 | 12/2006 |
| WO | 2012/103138 | A1 | 8/2012 |
| WO | 2016/019206 | A1 | 2/2016 |
| WO | 2016/094419 | A1 | 6/2016 |

OTHER PUBLICATIONS

Guy, N., "Review: Square, Inc. Square Credit Card Reader (2013)," iLounge, dated Jan. 16, 2014, Retrieved from the Internet URL: http://www.ilounge.com/index.php/reviews/entry/square-inc.-square-credit-card-reader-2013/, on Feb. 19, 2015, pp. 1-4.

Kuphaldt, T.R., "Practical Considerations—Batteries," Lessons In Electric Circuits, Batteries And Power Systems, Chapter 11, vol. I-DC, Retrieved from the Internet URL: www.allaboutcircuits.com/textbook/direct-current/chpt-11 /practical-considerations-batteries, on Jun. 9, 2017, pp. 1-5.

Scherz, P., "Practical Electronics for Inventors," The McGraw-Hill Companies, Inc., pp. 1-8 (2000).

Wehner, M., "The Unofficial Apple Weblog, Square credit card reader loses weight, gains accuracy", TUAW, dated Dec. 9, 2013, Retrieved from the Internet URL: http://www.tuaw.com/2013/12/09/square-credit-card—reader-loses-weight-gains-accuracy/, on Feb. 19, 2015, p. 1.

White, R., "How Computers Work," Que, Seventh Edition, pp. 1-23 (Oct. 15, 2003).

Non-Final Office Action dated Oct. 8, 2013, for U.S. Appl. No. 13/826,171, of Dorogusker, J., filed Mar. 14, 2013.

Notice of Allowance dated Jan. 24, 2014, for U.S. Appl. No. 13/826,171, of Dorogusker, J., filed Mar. 14, 2013.

Non-Final Office Action dated Jan. 29, 2014, in Design U.S. Appl. No. 29/447,765, of Templeton T., filed Mar. 6, 2013.

Non-Final Office Action dated Sep. 10, 2014, in Design U.S. Appl. No. 29/447,765, of Templeton T., filed Mar. 6, 2013.

Certificate of Design Registration for European Patent Application No. 002578674, dated Nov. 14, 2014.

Notification of Registration of a Design for Australian Application No. 201415781, dated Nov. 27, 2014.

First Examination Report for Indian Design Application No. 267386, dated Feb. 5, 2015.

Non-Final Office Action dated Feb. 20, 2015 for U.S. Appl. No. 14/512,104, of Templeton, T., et al., filed Oct. 10, 2014.

First Examination Report for Australian Design Application No. 201415781, dated Feb. 23, 2015.

Final Office Action dated Mar. 20, 2015, in Design U.S. Appl. No. 29/447,765, of Templeton T., filed Mar. 6, 2013.

English-language translation of Notice of Reasons for Rejection for Japanese Application No. 2014-025525, dated Mar. 31, 2015.

Notice of Allowance dated Jun. 5, 2015, in Design U.S. Appl. No. 29/447,765, of Templeton T., filed Mar. 6, 2013.

Notice of Allowance dated Jun. 10, 2015, for Design U.S. Appl. No. 29/491,147, of Templeton T., et al., filed May 16, 2014.

Examiner's Report for Canadian Industrial Design Application No. 159528, dated Jun. 11, 2015.

Non-Final Office Action dated Jun. 22, 2015 for U.S. Appl. No. 14/322,815, of Edwards, T., filed Jul. 2, 2014.

Certificate of Registration of Design for Indian Design Application No. 267386 dated Jul. 7, 2015.

Non-Final Office Action dated Jul. 27, 2015 for Design U.S. Appl. No. 29/493,212, of Edwards, T., et al., filed Jun. 6, 2014.

Non-Final Office Action dated Jul. 30, 2015, for U.S. Appl. No. 13/652,365, of Behren, R.V., et al., filed Oct. 15, 2012.

Second Examination Report for Australian Designt Application No. 201415781, dated Aug. 13, 2015.

Non-Final Office Action dated Sep. 18, 2015, for U.S. Appl. No. 14/450,128, of Wade, J., filed Aug. 1, 2014.

Notice of Allowance dated Oct. 5, 2015 for U.S. Appl. No. 14/322,815, of Edwards, T., filed Jul. 2, 2014.

English-language translation of Final Rejection for Japanese Application No. 2014-025525, dated Oct. 20, 2015.

Non-Final Office Action dated Oct. 29, 2015 for U.S. Appl. No. 14/512,104, of Templeton, T., et al., filed Oct. 10, 2014.

Ex parte Quayle Action mailed Nov. 20, 2015 for U.S. Appl. No. 14/620,699, of Wade, J., et al., filed Feb. 12, 2015.

Examiner's Report for Canadian Industrial Design Application No. 159528, dated Dec. 1, 2015.

Final Office Action dated Jan. 15, 2016, for Design U.S. Appl. No. 29/493,212, of Edwards, T., et al., filed Jun. 6, 2014.

Notice of Allowance dated Feb. 5, 2016, for U.S. Appl. No. 14/620,699, of Wade, J., et al., filed Feb. 12, 2015.

Examiner Requisition for Canadian Patent Application No. 2,920,589, dated Mar. 11, 2016.

Final Office Action dated Mar. 16, 2016, for U.S. Appl. No. 13/652,365, of Behren, R.V., et al., filed Oct. 15, 2012.

Notice of Allowance dated Mar. 28, 2016, for Design U.S. Appl. No. 29/493,212, of Edwards, T., et al., filed Jun. 6, 2014.

Non-Final Office Action dated Apr. 11, 2016, for U.S. Appl. No. 14/450,128, of Wade, J., filed Aug. 1, 2014.

Non-Final Office Action dated May 6, 2016, for U.S. Appl. No. 14/512,104, of Templeton, T., et al., filed Oct. 10, 2014.

Non-Final Office Action dated Aug. 16, 2016, for U.S. Appl. No. 14/312,524, of Edwards, T., filed Jun. 23, 2014.

Non-Final Office Action dated Aug. 17, 2016, for U.S. Appl. No. 14/985,624, of Wade, J., et al., filed Dec. 31, 2015.

Notice of Allowance for Canadian Patent Application No. 2,920,589, dated Sep. 21, 2016.

Notice of Allowance dated Oct. 7, 2016, for U.S. Appl. No. 14/512,104, of Templeton, T., et al., filed Oct. 10, 2014.

Non-Final Office Action dated Oct. 28, 2016, for U.S. Appl. No. 14/450,128, of Wade, J., filed Aug. 1, 2014.

Notice of Allowance dated Jan. 12, 2017, for U.S. Appl. No. 14/985,624, of Wade, J., et al., filed Dec. 31, 2015.

Non-Final Office Action dated Jan. 13, 2017, for U.S. Appl. No. 14/448,714, of Post, D., et al., filed Jul. 31, 2014.

Non-Final Office Action dated Feb. 9, 2017, for U.S. Appl. No. 14/472,217, of Post, D.J., et al., filed Aug. 28, 2014.

Final Office Action dated Feb. 23, 2017, for U.S. Appl. No. 14/312,524, of Edwards, T., filed Jun. 23, 2014.

(56) References Cited

OTHER PUBLICATIONS

Certificate of Industrial Design Registration for Canadian Design Application No. 159528, dated Feb. 27, 2017.
Certificate of Industrial Design Registration for Canadian Design Application No. 166511, dated Feb. 27, 2017.
Corrected Notice of Allowance dated Apr. 10, 2017, for U.S. Appl. No. 14/985,624, of Wade, J., et al., filed Dec. 31, 2015.
Notice of Allowance dated May 5, 2017, for U.S. Appl. No. 14/312,524, of Edwards, T., filed Jun. 23, 2014.
Notice of Allowance dated Jun. 12, 2017, for Design U.S. Appl. No. 29/539,675, of Templeton, T., filed Sep. 16, 2015.
Final Office Action dated Jun. 16, 2017, for U.S. Appl. No. 14/450,128, of Wade, J., filed Aug. 1, 2014.
Non-Final Office Action dated Jul. 10, 2017, for U.S. Appl. No. 14/448,714, of Post, D., et al., filed Jul. 31, 2014.
Non-Final Office Action dated Jul. 28, 2017, for U.S. Appl. No. 13/652,365, of Behren, R.V., et al., filed Oct. 15, 2012.
Notice of Allowance dated Aug. 22, 2017, for U.S. Appl. No. 14/472,217, of Post, D.J., et al., filed Aug. 28, 2014.
Notice of Allowance dated Aug. 31, 2017, for U.S. Appl. No. 14/450,128, of Wade, J., filed Aug. 1, 2014.
Office Action for European Patent Application No. 16 155 374.8, dated Oct. 18, 2017.
Final Office Action dated Mar. 7, 2018, for U.S. Appl. No. 13/652,365, of Behren, R.V., et al., filed Oct. 15, 2012.
Final Office Action dated Mar. 27, 2018, for U.S. Appl. No. 14/448,714, of Post, D. et al., filed Jul. 31, 2014.
Notice of Allowance dated Jun. 5, 2018, for U.S. Appl. No. 14/448,714, of Post, D., et al., filed Jul. 31, 2014.
Advisory Action dated Jun. 6, 2018, for U.S. Appl. No. 13/652,365, of Behren, R.V., et al., filed Oct. 15, 2012.
International Search Report and Written Opinion for International Application No. PCT/US2015/043027, dated Nov. 4, 2015.
Extended European Search Report for European Patent Application No. 16 155 374.8, dated Oct. 11, 2016.
Extended European Search Report for European Patent Application No. 15866468.0, dated Dec. 14, 2017.
Jorgensen, A., "Square," dated Nov. 19, 2010, Retrieved from the Internet URL: http://andrew.jorgensenfamily.us/2010/11/square/, on Jun. 6, 2014, p. 1-3.
Ryan, P., "Plug and Pay: A Gallery of 26 Mobile Card Readers," Aug. 20, 2013, Retrieved from the Internet URL: http://bankinnovation.net/2013/08/plug-and-pay-a-gallery-of-26-mobile-card-readers/, on Feb. 19, 2015, pp. 1-12.
Thomas, T., "iPhone Credit Card Readers," dated Feb. 11, 2011, Retrieved from the Internet URL: <http://credit-card-processing-review.toptenreviews.com/mobile-credit-card-processing/iphone-credit-card-readers-pg9.html>., on Jun. 6, 2014, p. 1-3.

Schaerer, T., "Vom Fensterkomparator zum Prazisions-Schmitt-Trigger," Elektronik Kompendium, Retrieved from the Internet URL: https://web.archive.org/web/20140805054448/http://www.elektronik-kompendium.de/public/schaerer/wincst.htm, pp. 1-22 (Aug. 5, 2014).
Summons to attend oral proceedings for European Patent Application No. 16 155 374.8, dated Mar. 5, 2019.
Notice of Allowance dated Jul. 3, 2019, for U.S. Appl. No. 13/652,365, of Behren, R.V., et al., filed Oct. 15, 2012.
Non-Final Office Action dated Aug. 14, 2019, for U.S. Appl. No. 15/692,501, of Edwards T., filed Aug. 31, 2017.
"Connection of Terminal Equipment to the Telephone Network," FCC 47 CFR Part 68, Retrieved from the URL: http://www.tscm.com/FCC47CFRpart68.pdf, on Sep. 24, 2019 Oct. 1, 1999 Edition.
"Embedded FINancial transactional IC card READer," Retrieved from the URL: https://cordis.europa.eu/project/rcn/58338/factsheet/en.
Geethapriya Venkataramani and Srividya Gopalan., "Mobile phone based RFID architecture for secure electronic payments using RFID credit cards," 2007 IEEE, (ARES'07).
"Guideline for the Use of Advanced Authentication Technology," FIPS 190, Sep. 28, 1994.
"Identification cards—Recording technique—Part 4—Location of read-only magnetic tracks—Track 1 and 2," ISO/IEC 7811-4:1995, International Organization for Standardization, Aug. 1995.
Jerome Svigals., "The Long Life and Imminent Death of the Mag-stripe Card," IEEE Spectrum, vol. 49, Issue 61, Jun. 2012.
"Magensa's Decryption Services and MagTek's MagneSafe™ Bluetooth Readers Selected by eProcessing Network to Implement Secure Customer Card Data with Mobile Devices," Retrieved from the URL: https://www.magnensa.net/aboutus/articles/eProcessing - rev1.pdf Apr. 14, 2008.
Martha E. Haykin et al., "Smart Card Technology: New Methods for Computer Access Control," NIST Special Publication 500-157, Sep. 1988.
"MSP430x1xx Family User's Guide," (including 2016 correction sheet at 2), Texas Instruments Inc., 2006.
Spegele, Joseph Brain., "A Framework for Evaluating Application of Smart Cards and Related Technology Within the Department of Defense," Naval Postgraduate School, Jan. 1995.
Stephen A. Sherman et al., "Secure Network Access Using Multiple Applications of AT&T's Smart Card," AT&T Technical Journal, Sep./Oct. 1994.
Notice of Allowance dated Oct. 22, 2019, for U.S. Appl. No. 15/692,501, of Edwards, T., filed Aug. 31, 2017.
Decision to Grant for European Patent Application No. 16155374.8, dated Nov. 14, 2019.

* cited by examiner

MONITORING BATTERY HEALTH OF A BATTERY USED IN A DEVICE

BACKGROUND

Consumers can interact with merchants to conduct various financial payment transactions. For example, with the proliferation of mobile computing devices (e.g., smart phones and tablet computers, etc.), development of various attachable hardware devices has increased to provide expanded functionality to such devices. One such example is an attachable magnetic card reader device, used for reading credit or debit card information to facilitate the receipt and processing of payments. Some of these reader devices can be physically and communicatively coupled to an associated mobile device using a standard 3.5 mm audio plug when inserted into the headphone port of the mobile device. Given the nature of these devices, it can be desirable to monitor the health of the device's power source (e.g., battery) to determine, for example, an amount of power remaining before the power source is depleted. Such information can be useful, for example, for determining when to power down various components of the device such that the powering down occurs gracefully before the battery power is drained, or before the battery is damaged from overuse.

BRIEF DESCRIPTION OF THE DRAWINGS

In order to describe the manner in which features of the disclosure can be obtained, a more particular description of the principles will be rendered by reference to specific embodiments thereof which are illustrated in the appended drawings. Understanding that these drawings depict only example embodiments of the disclosure and are not therefore to be considered to be limiting of its scope, the principles herein are described and explained with additional specificity and detail through the use of the accompanying drawings in which.

DETAILED DESCRIPTION

Figure 1:
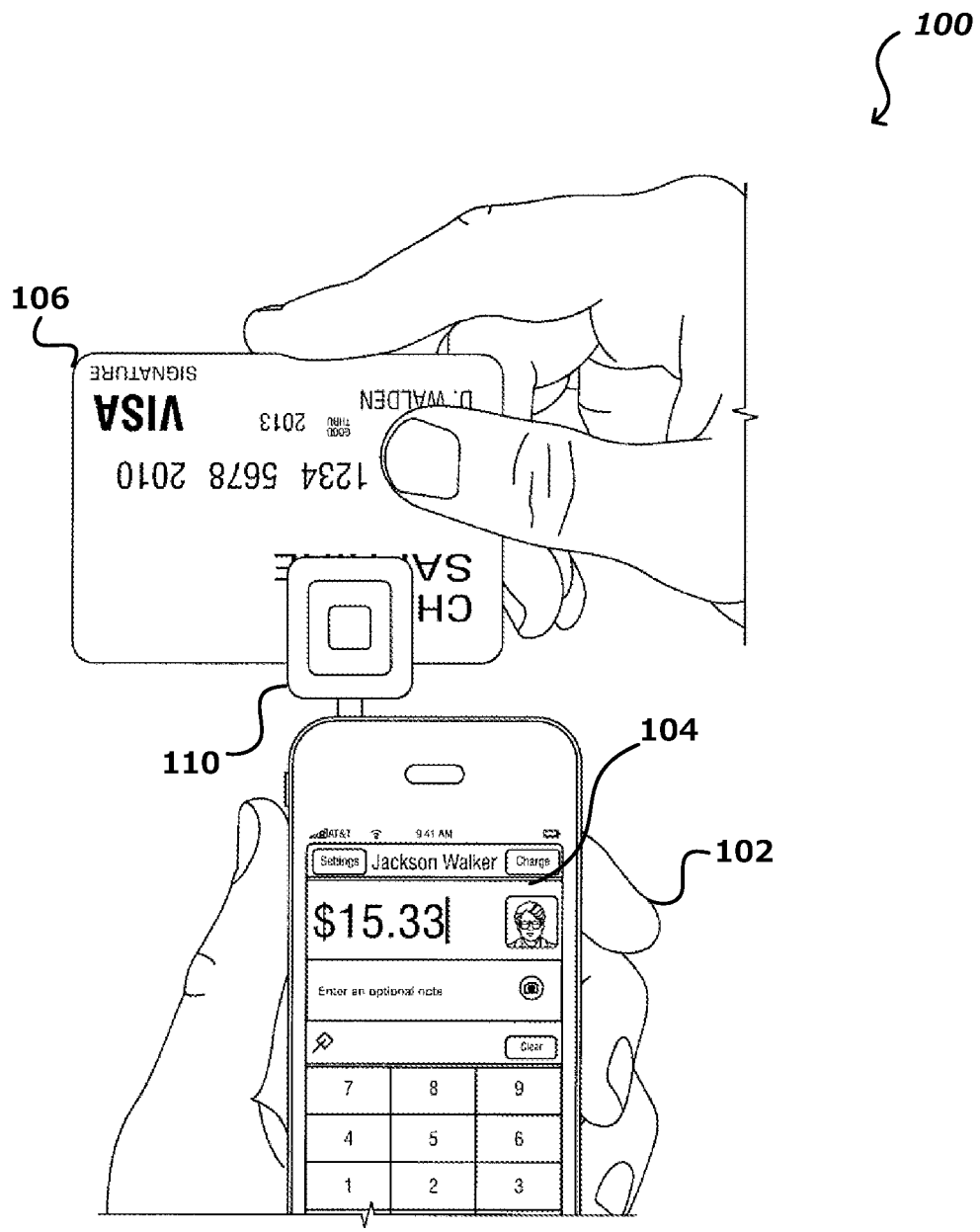
FIG. 1 illustrates an example situation of a customer interacting with a merchant to conduct a financial payment transaction in accordance with various embodiments.

Systems and methods in accordance with various embodiments of the present disclosure overcome one or more of the above-referenced and other deficiencies in conventional approaches to measuring battery health in an electronic device. In particular, various embodiments enable a processor to determine a state of a power source, e.g., a rechargeable battery, to manage the operation of the device.

For example, in accordance with various embodiments, a card reader device or other electronic device can be provided, where the device can include, for example, a read head including a slot for swiping of a magnetic stripe of a buyer's financial transaction card. In various embodiments, the card reader head can include a dip slot for accepting integrated circuit cards, such as those conforming to the Europay, Mastercard, and Visa (EMV) standard. The card reader can also include an EMV contactless antenna, coupled to a contactless EMV reader for receiving and processing data from the antenna. The contactless antenna can also be used for near-field communication (NFC) and other low-power communication channels. The read head is configured to read data on the magnetic stripe and/or integrated circuit and produce a signal indicative of the data stored on the magnetic stripe. The card reader device can include one or more power sources and various other components. The power sources can include, for example, a rechargeable battery among other power sources. In this example, the rechargeable battery can be coupled to circuitry such as tamper protection circuitry and battery protection circuitry. The rechargeable battery can be configured to provide power to various device components, as may include at least one of the read head and the circuitry.

In accordance with various embodiments, components in the card reader device can be modulated to expose the battery to various loads. Any changes in the battery's analog voltage that result from the loads can be measured, for example, by a processor in the card reader device. Based on the load amounts and corresponding changes in the battery's analog voltage, the processor is able to determine the battery's internal cell resistance. The processor can correlate the battery's internal cell resistance to the health of the battery.

In one example, the battery can be exposed to a first load by setting a first system clock speed, as determined by a phase-locked loop (PLL), which, as a result, can change the amount of power that is used from the battery. In various embodiments, the rate of power consumption resulting from performing the first load is pre-determined. Next, the battery can be exposed to a second load by setting a second system clock speed, which, again, can change the amount of power that is drained from the battery. Similarly, in various embodiments, the rate of power consumption resulting from performing the second load is also pre-determined. The timing between performing the first load and performing the second load can be near instant or within a short amount of time (e.g., one second). As mentioned, the processor can measure any changes to the battery's analog voltage that result from varying the amount of power that is used from the battery to satisfy the first and second loads. Based on the changes to the battery's analog voltage between exposing the battery to the first and second loads, the processor is able to determine the battery's internal cell resistance. Among other uses, the battery's internal cell resistance can be used to determine what amount of analog voltage, for example, as determined by the processor, should trigger actions such as generating an alert to indicate that the battery power is low.

Although the embodiments described herein specifically refer to a card reader device, the approaches described herein may be performed by any computing device. Other advantages, variations, and functions are described and suggested below as may be provided in accordance with the various embodiments.

FIG. 1 illustrates an example situation 100 of a user 102 interacting with card reader device 110 of a merchant or other entity to conduct a financial payment transaction ("transaction"). In this example, the user 102 is shown conducting a transaction with the merchant or other entity at a point-of-sale register using a payment card, e.g., a credit card. These payment instruments are usually associated with an established consumer account. It should be further noted that although a credit card is shown to conduct transactions, approaches described herein apply to other types of financial payment instruments including, for example, debit cards, and card-less payment accounts.

The card reader device 110 can also include a power source such as a rechargeable battery. As mentioned, having the ability to determine the health of a battery is useful in managing the operation of devices. For example, knowing the health of the battery can be useful in determining when to alert a user that the battery is low on power and needs recharging. Further, knowing the health of the battery can also be used to determine when additional strain on the battery is likely to reduce the battery's level of operation needed for the card reader device 110 to operate property. For example, the card reader device 110 may determine that, based on the battery's internal cell resistance, additional strain on the battery resulting from the insertion of an EMV card into the card reader device 110 is likely to cause a drop in voltage (e.g., brownout) that prevents the card reader device 110 from functioning properly.

One conventional approach to monitoring a battery's health involves a coulomb counting approach that measures the current that flows in and out of the battery. This approach generally requires the use of a gas or fuel gauge integrated circuit to be implemented in the card reader device 110. However, such chips can be costly to implement and may result in additional overhead that is not practical for many devices such as the card reader device 110. The approaches described herein provide for the monitoring a battery's health without the need for such fuel gauge chips or other conventional approaches. In accordance with various embodiments, the battery's internal cell resistance can be measured by modulating a processor in such a way so as to expose the battery to different amounts of power consumption or loads, as described in reference to FIG. 2.

Figure 2:
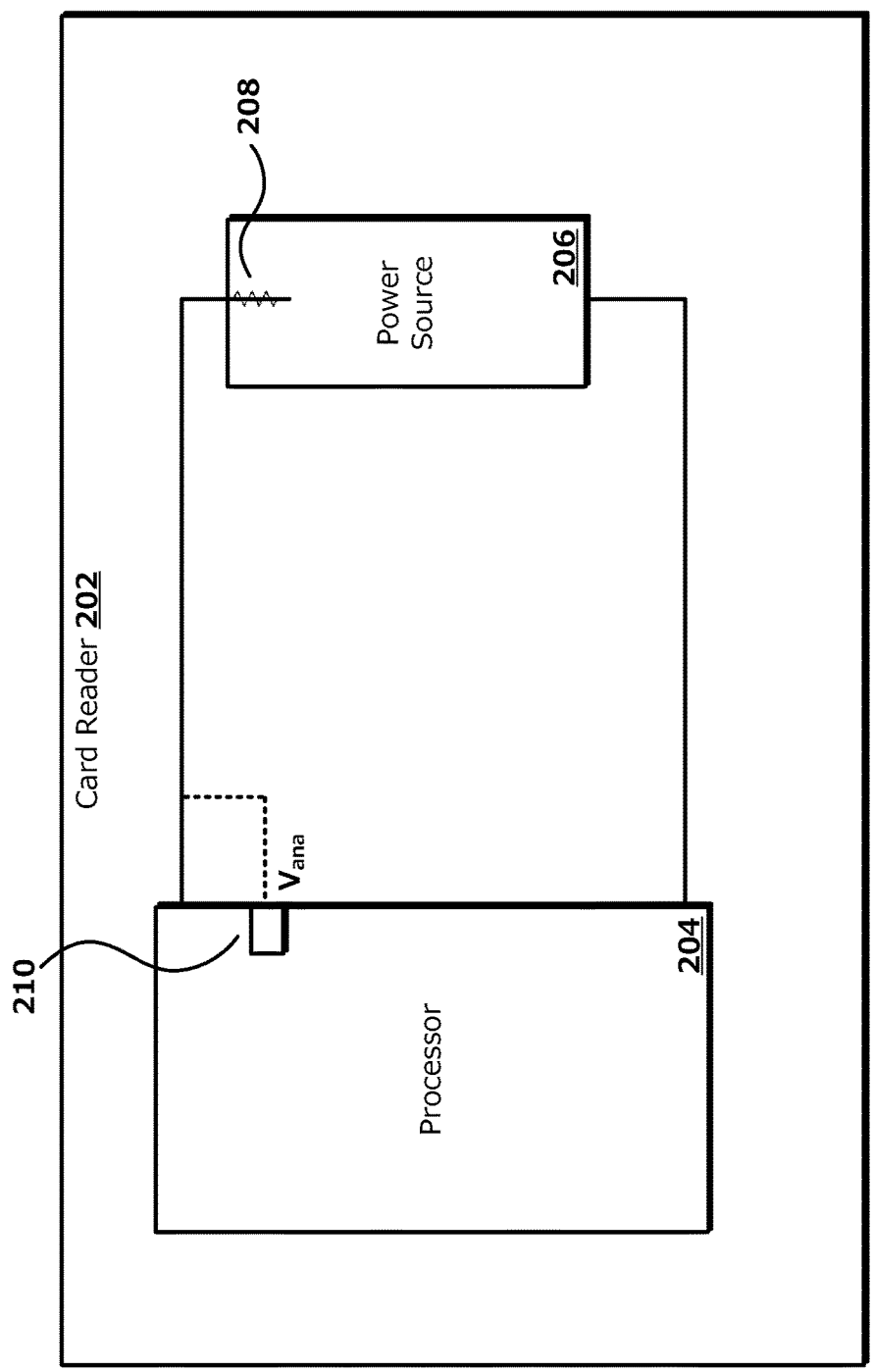
FIG. 2 illustrates an example block diagram of a card reader device that can measure an internal rate of resistance for a battery in accordance with various embodiments.

FIG. 2 illustrates a detailed view 200 of a card reader device 202 in accordance with various embodiments. As shown in FIG. 2, a card reader device 202 can include, for example, a processor 204 (e.g., microprocessor or microcontroller) and a power source 206 (e.g., a rechargeable battery). The battery 206 can service various system loads of the device (e.g., read head, tamper protection circuitry, system components, etc.).

As the battery 206 provides power to the card reader device 202, the power level of the battery 206 will decrease. For example, when the battery 206 is brand new, on a full charge, the battery may be 4.2 volts. For purposes of the device 202, for example, a voltage of 3.3 to 3.4 may be the minimum at which point the battery 206 is considered run down. Some types of batteries, e.g., lithium polymer cells, can be permanently damaged if exposed to loads that run the battery past a certain point. To prevent such damage, the device 202 can include a protection circuit that cuts off access to the battery, for example, by opening up an electronic switch, once the battery voltage reaches a certain point, e.g., 2.9 volts. Ideally, the device 202 should be able to determine the state of the battery ahead of time before such a protection circuit is triggered so that the device 202 can properly power down. Therefore, in various embodiments, the battery voltage is monitored using the processor 204. For example, the processor 204 can monitor the voltage of the battery 206 using a standard analog input pin 210 that can sample an analog voltage. In various embodiments, the processor 204 can be configured to convert the analog voltage to a voltage level of the battery and take appropriate action such as powering itself down and/or causing the device 204 to power down.

Typically, as the battery ages over time, the battery's internal cell resistance 208 ($R_{cell}$) increases. As it increases, this internal cell resistance 208 can cause various problems in ensuring adequate operation of the device 202. As mentioned, knowing the battery's internal cell resistance can be useful in determining when additional strain on the battery is likely to reduce the battery's voltage below a level needed for the card reader device 202 to operate property, and such levels may permanently damage the battery. Therefore, in various embodiments, the device 202 can be configured to monitor the battery's internal cell resistance 208 by exposing the battery 206 to various loads having a known rate of power consumption.

For example, the device 202 can determine that the battery 206 has completed a charge cycle. To perform a charge cycle, the device 202 is typically plugged-into a charger (e.g., Universal Serial Bus or USB charger) that forces the device 202 to power on and also causes software to begin executing in response. During this process, the device 202 can determine that a charge cycle is underway and can also determine when the charge cycle has completed. Further, during this process, the battery 206 is not used while the processor 204 remains powered on. When the charger is unplugged from the device 202, the device 202 can determine that the charge cycle has completed and can begin the discharge cycle. In various embodiments, when the discharge cycle is activated, for example, upon the charger or charger cable being unplugged from the device 202, the device 202 can perform various operations to determine the battery's health (e.g., internal cell resistance). Depending on the implementation, triggering the various operations to determine the battery's health may be performed upon determining that the battery 206 was fully charged, charged to a threshold amount (e.g., 60 percent charge), or charged for a threshold amount of time (e.g., 45 minutes).

In various embodiments, the processor 204 can expose the battery 206 to a first load having a known rate of power consumption, e.g., 20 milliamps. In one example, the processor 204 can expose the battery 206 to the first load by performing a loop that simply waits for an interrupt state without performing any real operation other than use power at a consistent rate. The actual power drawn by the processor for such loads can be modeled ahead of time so the power consumption for any given load is pre-determined. During the time the battery is being exposed to this first load, the processor 204 can measure the analog voltage ($V_{ana}$) using the pin 210. In this example, the first load is 20 milliamps and, in response to the first load, the analog voltage measures at 3.4 volts.

Next, the processor 204 can expose the battery 206 to a second load that also has a different known rate of power consumption, e.g., 35 milliamps. Again, the processor 204 can expose the battery 206 to the second load by performing some pre-determined action such as running a loop. During the time the battery is being exposed to this second load, the processor 204 can again measure the analog voltage ($V_{ana}$) using the pin 210. In this example, the second load is 35 milliamps and, in response to the second load, the analog voltage measures at 3.31 volts. In various implementations, to improve accuracy, the battery is exposed to the first load and the second load without interrupting the card reader device 202 with any operations that may also draw power from the battery. For example, an interrupt system configured to manage interrupts to the processor 204 can be disabled. Additionally, the timing between exposing the battery 206 to the first load and exposing the battery 206 to the second load can be near instant or within a short amount of time (e.g., one second). That is, the battery 206 is exposed to the first and second loads before the charge level of the battery 206 changes appreciably. As a result, the battery's voltage level, as well as the battery's internal cell resistance, can be assumed to be relatively the same between the exposures of the two loads. Based on these two readings, the device 202 can solve for the battery's internal cell resistance as well as the battery's voltage level using a set of linear equations. One example linear equation is:

$$V_{ana}=I*R+V_{bat} \quad \text{(Equation 1)}$$

where $V_{ana}$ is the measured analog voltage in response to a load, I is the load amount, R is the battery's internal resistance, and $V_{bat}$ is the battery's voltage level.

In this example, the following linear equations can be solved to determine the battery's internal cell resistance as well as the battery's voltage level based on the two readings:

$$3.4=20*R+V_{bat} \quad \text{(Equation 2)}$$

$$3.31=35*R+V_{bat} \quad \text{(Equation 3)}$$

where 3.4 is the analog voltage measured in response to the first load, 20 is the first load amount, 3.31 is the analog voltage measured in response to the second load, 35 is the second load amount, R is the battery's internal resistance, and $V_{bat}$ is the battery's voltage level.

In some embodiments, after being exposed to the first and second loads, the battery 206 is exposed to a third load that is the same as the first load, followed by exposure to a fourth load that matches the second load. In such embodiments, the analog readings from the first load and the third load are averaged to determine a first average analog voltage. Similarly, the analog readings from the second load and the fourth load are averaged to determine a second average analog voltage. The first average analog voltage and the first load can be used in one linear equation. Similarly, the second average analog voltage and the second load can be used in another linear equation. These two linear equations can be used to solve for the battery's internal rate of resistance, as described above.

Other approaches can be used to expose the battery to vary the loads. For example, the battery can be exposed to a first load by performing a set of instructions stored in the device at a first system clock speed (e.g., 60 megahertz) and exposing the battery to a second load by performing the set of instructions stored in the device at a second system clock speed (e.g., 120 megahertz) that is different from the first system clock speed. By varying the frequencies, the battery 206 can be exposed different amounts of power drain since higher frequencies tend to use more power, for example, to speed up the processing of instructions. Another approach is to determine the loads by activating and/or deactivating other components in the device 202 such as light emitting diodes (LEDs) or a card power supply. Similarly, different peripherals of the processor 204 can be turned on and/or turned off using software "clocking" approaches. Such peripherals can include analog-to-digital convertor blocks, timer subsystems, various communication blocks, etc. As mentioned, each load can be pre-determined and information describing the load including, for example, the load amount (e.g., the amount of milliamps) and any operations (e.g., modify clock speed, activating and/or deactivating components, etc.) that need to be performed by the device or the processor to expose the battery to the respective load, can be stored in a memory of the device. Such information can be accessed by software that executes on the device to perform the approaches described herein.

Figure 3:
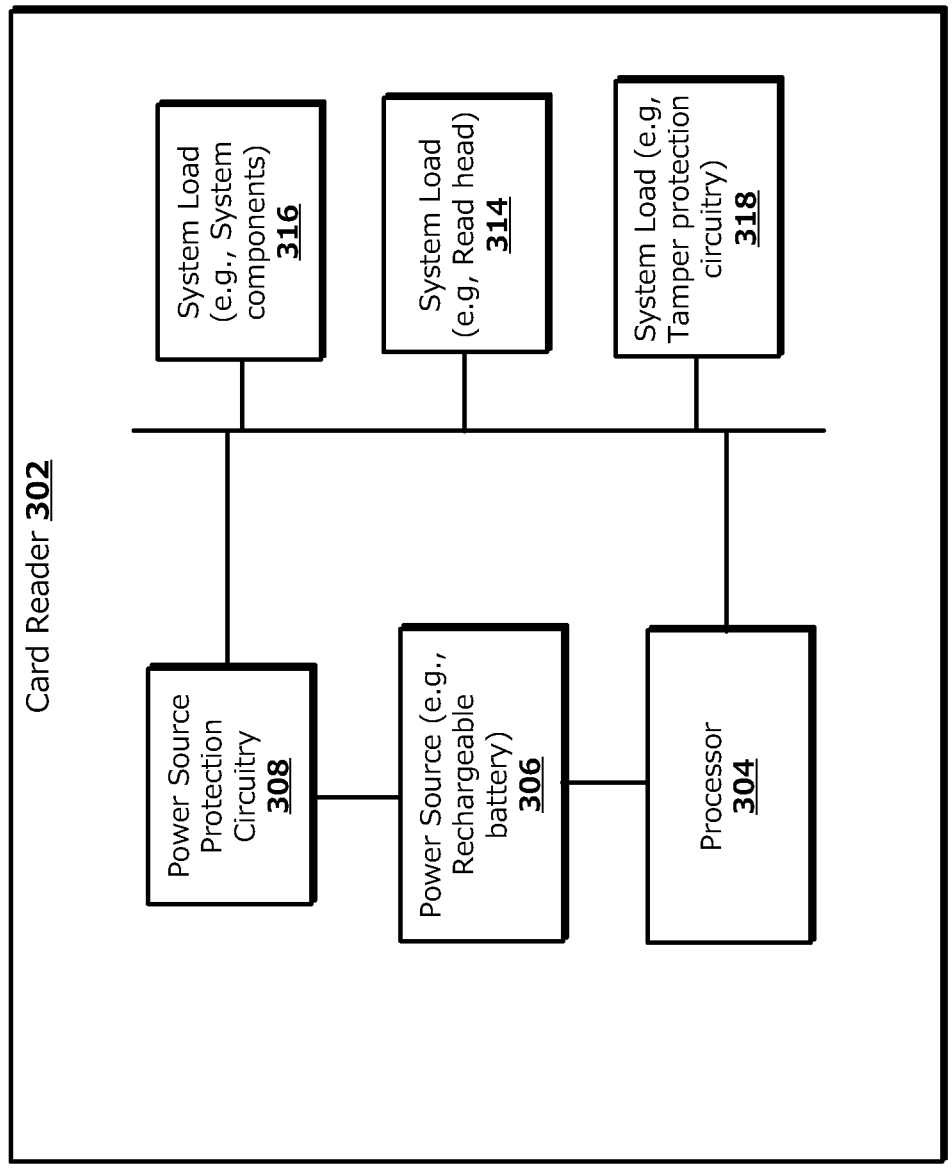
FIG. 3 illustrates another example block diagram of a card reader device that can measure an internal rate of resistance for a battery in accordance with various embodiments.

FIG. 3 illustrates an example block diagram 300 of a system in accordance with an embodiment. As shown in FIG. 3, a card reader device 302 includes, for example, a processor 304, a power source 306 (e.g., a rechargeable battery), a power source protection circuitry 308, and one or more system loads (314, 316, and 318) (e.g., read head, tamper protection circuitry, system components, backup circuitry, etc.). In accordance with various embodiments, the card reader device can be used to facilitate a financial transaction between entities. For example, the card reader device can be coupled to a computing device (e.g., a mobile phone, tablet computer, etc.) where the computing device can run a merchant application or other financial transaction software that can provide functionality to facilitate a point-of-sale such as by enabling payment transactions. The merchant application can be downloaded and installed on the computing device and the application can be configured to operate with a card reader, where an individual can complete a financial transaction by swiping a magnetic stripe card through the card reader connected to the computing device. In this example, the financial transaction can be any transaction that involves receiving or sending payment from one person to another. The magnetic stripe card can be, for example, a credit card, a debit card, or other types of payment authenticating pieces capable of carrying out the financial transaction. In accordance with various embodiments, the size of the card reader is miniaturized to be portable for connection with the computing device. The card reader is configured to reliably read data encoded in a magnetic strip of the card with minimum error in a single swipe and provide a signal that corresponds to the data read to the computing device, which then decodes the incoming signal from the card reader and acts as a point-of-sale device to complete the financial transaction.

As shown in FIG. 3, the rechargeable battery 306 can be coupled to the processor 304, the power source protection circuitry 308. The rechargeable battery 306 can, for example, be one of a lead-acid battery, a nickel cadmium battery (NiCd), a nickel metal hydride (NiMH) battery, a lithium ion (Li-ion) battery, or a lithium ion polymer (Li-ion polymer) battery.

The power source protection circuitry (e.g., charge controller, charge regulator, battery regulator or protection circuitry, etc.) 308 can be configured to limit the rate at which electric current is added to or drawn from the rechargeable battery. Further, in accordance with various embodiments, the protection circuitry 308 can prevent overcharging and may protect against overvoltage, which can reduce battery performance or lifespan, and may pose a safety risk. It may also prevent completely draining ("deep discharging") the rechargeable battery, or perform controlled discharges, depending on the battery technology, to protect battery life. In accordance with various embodiments, the protection circuitry 308 can include one or more electrical components or can be encapsulated in a single microchip, an integrated circuit (IC) such as a charge controller IC or charge control IC.

The systems loads can include, for example, the read head, tamper protection circuitry, backup system components, or various other system components. The backup system can include, for example, the tamper protection circuitry, real-time clock, memory and other components. The tamper protection circuitry can be configured to detect tampering of at least one of physical or electrical components of the card reader. Physical tampering can include, for example, detecting whether the card reader device has be opened or whether a component (e.g., physical or electrical component) has be modified. Electrical tampering can include at least one of modify the path of electrical current, modifying code, etc. In accordance with various embodiments, when the card reader device 302 is active, power is drawn from the rechargeable battery 306 and used to power at least system loads 314, 316, and 318.

A discharge curve of the rechargeable battery can be modeled in terms of the battery's internal resistance, as determined using the approaches described above. When taking analog measurements of the battery 306, the processor 304 and/or the device 302 can use this model to determine any appropriate actions to be taken. For example, upon determining that the voltage of the rechargeable battery has dropped to a threshold voltage, the device 302 can activate an alert indicating that the battery 306 is low on power and needs to be recharged. For example, the alert may be activated in the form of activating LEDs on the device 302, displaying a message on a display interface of the device 302 or a computing device to which device 302 is coupled.

Figure 4:
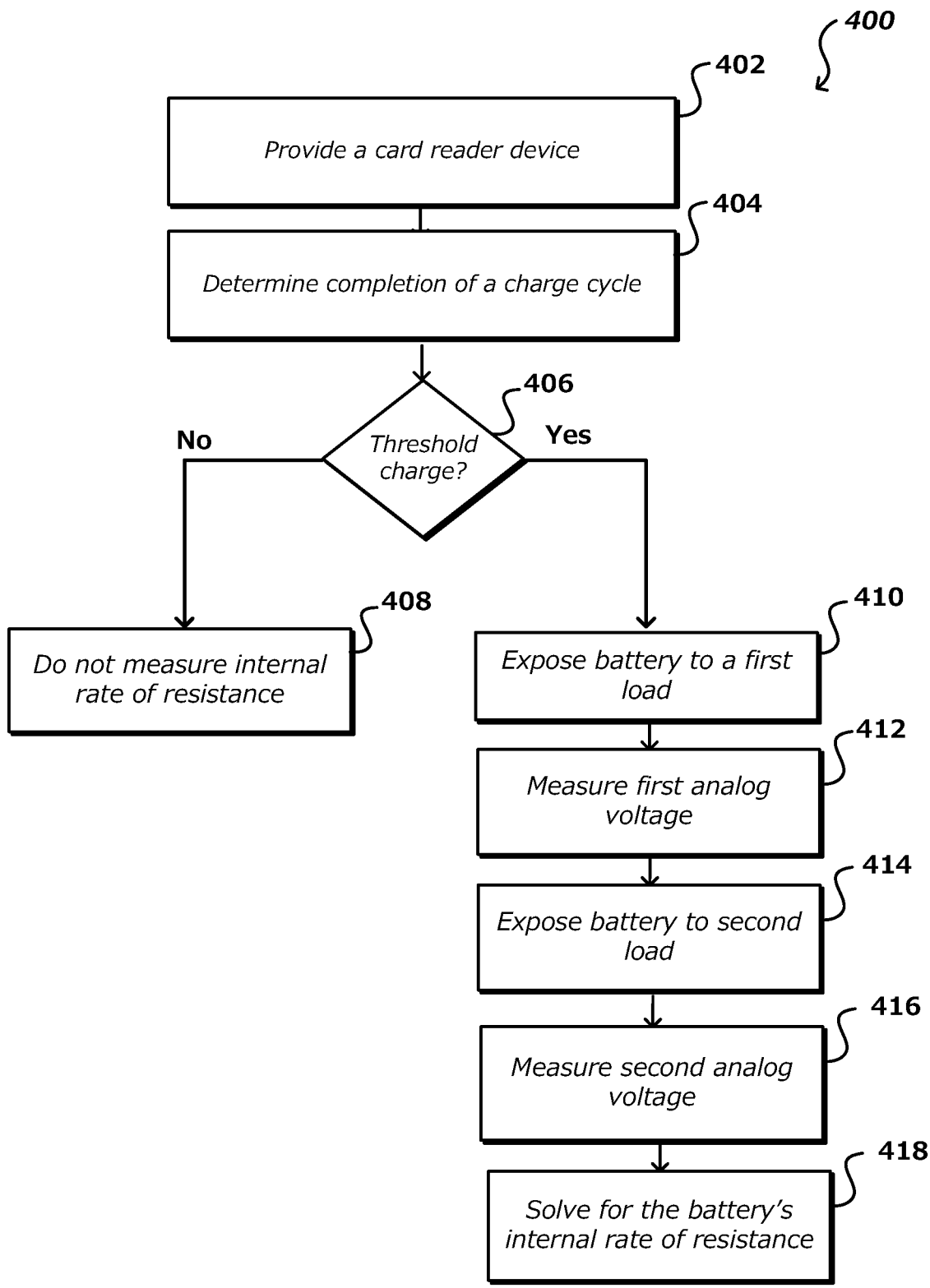
FIG. 4 illustrates an example process for exposing a battery to various loads for measuring the battery's internal rate of resistance in accordance with various embodiments.

FIG. 4 illustrates an example process 400 for exposing a battery to various loads for measuring the battery's internal rate of resistance in accordance with various embodiments. A portable computing device (e.g., a mobile phone, a tablet computer, etc.) configured to run a merchant application or other software can be provided. For example, in accordance with various embodiments, a card reader device or other electronic device can be provided 402, where the card reader device can include, for example, a read head including a slot for swiping of a magnetic stripe of a buyer's financial transaction card with the slot in response to a financial transaction between a buyer and seller, the read head configured to read data on the magnetic stripe and producing a signal indicative of data stored on the magnetic stripe. In various embodiments, the card reader head can include a dip slot for accepting integrated circuit cards, such as those conforming to the Europay, Mastercard, and Visa (EMV) standard. The card reader device can include one or more power sources and various other components. The power sources can include, for example, a rechargeable battery. In this example, the rechargeable battery can be coupled at least to tamper protection circuitry and a battery protection circuitry. The rechargeable battery can be configured to provide power to various device components, which may include at least one of a processor, the read head and the tamper protection circuitry. In some embodiments, the power sources can include, for example, a non-rechargeable battery. Example non-rechargeable batteries include alkaline batteries, aluminum-ion batteries, dry cell batteries, lithium batteries, among others.

In various embodiments, the device is configured to monitor the battery's internal cell resistance by exposing the battery to various loads having a known rate of power consumption. The device can determine 404 a completion of the battery's charge cycle. As mentioned, to perform a charge cycle, the device is typically plugged-into a charger (e.g., Universal Serial Bus or USB charger) that forces the device to power on and also causes software to begin executing in response. During this process, the device can determine that a charge cycle is underway and can also determine when the charge cycle has completed. When the charger is unplugged, the device can determine that the charge cycle has completed and can begin the discharge cycle. The device can determine 406 whether the charge cycle satisfies a threshold. In various embodiments, when the discharge cycle is activated, for example, upon the charger or charger cable being unplugged from the device, the device can perform various operations to determine the battery's health (e.g., internal cell resistance). Depending on the implementation, triggering the various operations to determine the battery's health the operations may be performed upon determining that the battery was fully charged, charged to a threshold amount (e.g., 80 percent charge), or charged for a threshold amount of time (e.g., 60 minutes). If the threshold has not been met, then the device does not measure 408 the battery's internal rate of resistance.

However, if the threshold has been met, the device or processor in the device exposes 410 the battery to a first load of a known rate of power consumption. As mentioned, various actions can be taken to ensure that the device or processor is not interrupted while the battery is being exposed to loads. For example, the device can disable all interrupts or set flags in the operating system indicating that a special subroutine is being performed in response to the device being unplugged from the charger and that this subroutine has exclusive use of the components of the device. In another example, when the device is unplugged from the charger, any software running on the device can be configured to not run operations or respond, for example, to any calls, until the process 400 completes.

During the time the battery is being exposed to this first load, the processor can measure 412 the analog voltage ($V_{ana}$), for example, using an analog pin. Next, the processor can expose 414 the battery to a second load that also has a different known rate of power consumption. During the time the battery is being exposed to this second load, the processor can again measure 416 the analog voltage ($V_{ana}$) using the pin. As mentioned, the timing between exposing the battery to the first load and exposing the battery to the second load can be near instant or within a short amount of time (e.g., one second or immediately after). Based on these two readings, the device can solve 418 for the battery's internal rate of resistance as well as the battery's voltage level using a set of linear equations, as described above.

Figure 5:
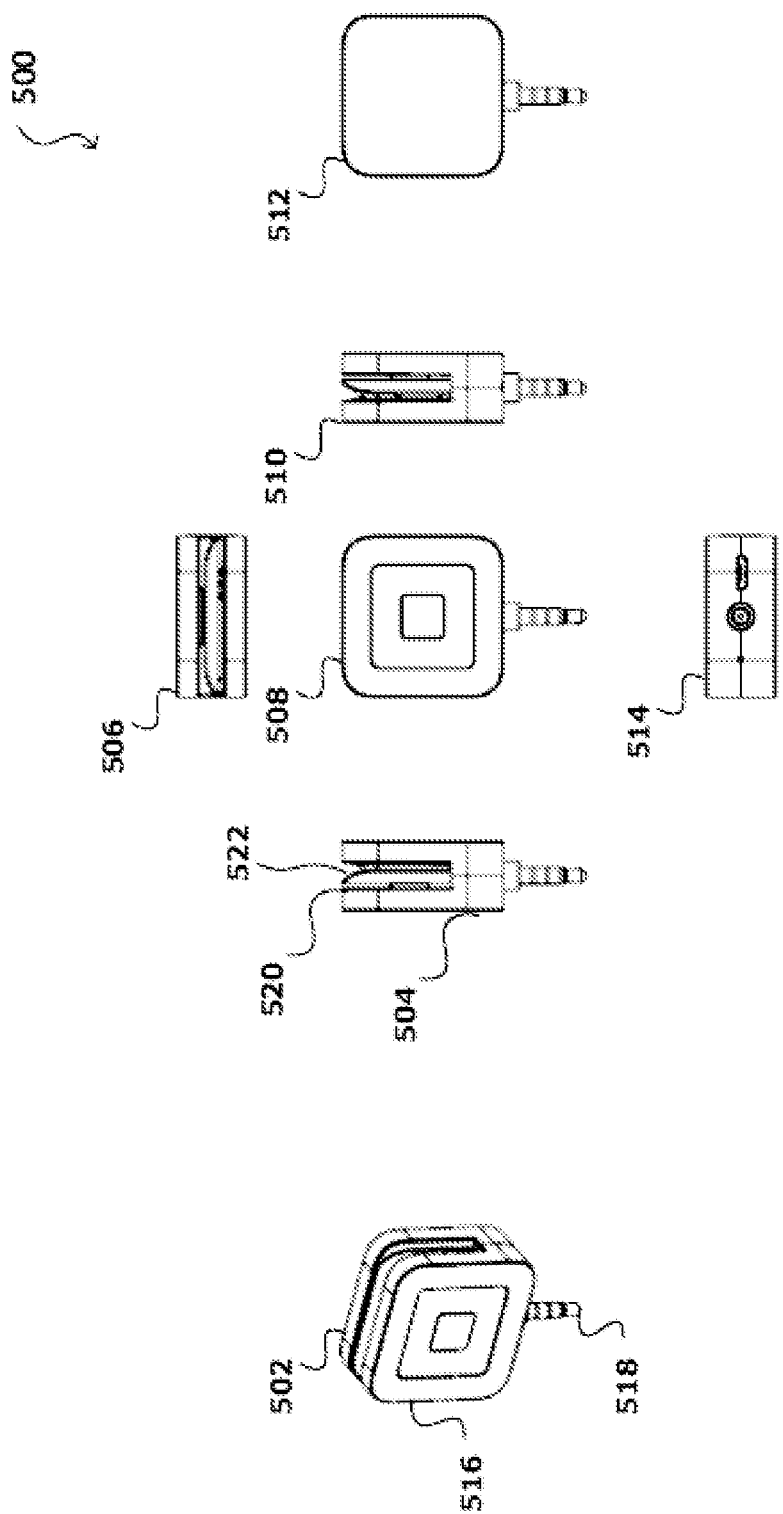
FIG. 5 illustrates views of an example card reader device that can be used in accordance with various embodiments.

FIG. 5 depicts an example 500 of an external structural diagram of a miniaturized card reader in accordance with an embodiment. In accordance with various embodiments, the card reader can accept financial information from chip cards. Chip cards, e.g., Europay, Mastercard, Visa (EMV) cards, are cards that include an integrated circuit that can provide authentication, identification, and application processing for conducting a transaction. In some implementations, the integrated circuit stores sensitive data, e.g., a personal identification number (PIN). Card readers, such as those depicted in FIG. 5, can read data from the integrated circuit on the chip card and provide the data to a host, e.g., a computer or point of sale terminal or mobile wireless device.

To perform a transaction using a chip card and a chip card reader, a user inserts the chip card into the chip card reader. The integrated circuit of the chip card resides at a predetermined position on the chip card, e.g., according to standard chip card specifications. Generally, housing of the chip card reader includes sides that are wide enough, e.g., slightly wider than the chip card, to form a close-ended groove so, upon insertion, the ends of the groove constrain the chip card so that the chip card will not move laterally. The chip card reader also can read the chip card using circuitry positioned over the integrated circuit when the chip card reaches a final position inside the groove. The circuitry can be a printed circuit board that interacts with the integrated circuit. When the chip card is inserted into the chip card reader, the printed circuit board can be coupled to contacts that come into physical contact with contacts of the chip card's integrated circuit. The chip card reader can communicate with the chip card reader through the contacts Illustrated in FIG. 5 are views 502, 504, 506 508, 510, 512, and 514 of such a card reader. The views includes a front-facing view 508, side views 504 and 510, back-side view 512, bottom view 517, top view 506, and three quarter view 502. As shown in view 502, the card reader includes a housing 516 and a signal plug 518 extending out from the housing. The housing can be physically and communicatively coupled to the signal plug, which can be removably inserted into a headphone port of a host device, such as a smart phone, personal computer, tablet device, or the like. The signal plug can form part of an audio bus that includes left and right audio output channels, an audio input channel (via microphone contact), and a ground connection (via ground contact). Once the signal plug is inserted into the compatible jack of a host device, such as a smartphone, bi-directional communication between the card reader device and the host is enabled e.g., via the left/right audio output channels and audio input channel, using the methods and systems discussed above.

For example, the housing can include two slots (520 and 522), a read head configured to accepts at least two types of contact with a card, and an optional and various circuitry. The two different types of slots can be configured for conducting a financial transaction between entities. In accordance with an embodiment, a first slot 522 can allow for a magnetic stripe element of a card to be swiped. The second slot 520 includes contact elements which allow the card to be "dipped in". Accordingly, in accordance with various embodiments, the device can receive a swipe and/or a "dipping" of a card into the one of the slots for conducting a financial transaction. It should be noted that other components, elements, and/or aspects of the card reader including structural and internal and described further in the application.

In accordance with various embodiments, the second slot can include a plurality of contact elements which allow the card to be "dipped" into the read head to conduct a financial transaction. In certain embodiments, the number of contact leads of the reader is more than the card so you don't have to be stuck dipping in one orientation. In various embodiments, instead of having closed sides, the card reader can have open sides that allow the card to move laterally when inserted into a slot, as illustrates in top view 506 and side views 504 and 510. The card reader can include an array of contacts coupled to a frame of the card reader. The array of contacts can have more contacts than a number of contacts on an integrated circuit of the chip card. The card reader can determine which contacts of the array of contacts, e.g., reader contacts, are in contact with the contacts of the integrated circuit, e.g., card contacts, and the card reader can select those reader contacts to communicate with the chip card.

Implementations can include one or more of the following features. Density of the plurality of reader contacts on the frame is twice as high as density of the plurality of card contacts. The subset of contacts are positioned to engage with the plurality of card contacts when the insertion of the chip card reaches a bottom edge of the card reader. An audio jack comprising circuitry configured to communicate with a mobile device. Circuitry configured to communicate with magnetic stripe cards. The frame comprises a transparent panel that overlays at least a portion of the plurality of reader contacts. Circuitry that displays an indication when the subset of reader contacts is selected. Circuitry that outputs an audio signal when the subset of reader contacts is selected. Circuitry is configured to perform operations comprising: applying, for one or more reader contacts in the plurality of reader contacts, power to the respective contact; measuring, for the one or more reader contacts, whether power is being drawn from the respective contact; and selecting the subset of reader contacts based on whether power is drawn from the one or more reader contacts.

In accordance with various embodiments, as described, the housing includes a first slot through which a payment card, such as a credit or debit card, may be swiped. Passage of a magnetic stripe of the payment card past a read head can enable payment information to be received via the read head. The resulting signal provided by the read head is typically an analog signal that must be digitized e.g., using ADC, before the resulting digital information is provided to microcontroller. Different types of information can be read from a magnetic stripe, depending on implementation. For example, user and payment card account information can be read from track 1 and track 2 of the magnetic stripe, respectively. However, in other implementations, any track (or combination of tracks) may be read from the magnetic stripe, including any combination, or all of tracks 1, 2 and 3.

Figure 6:
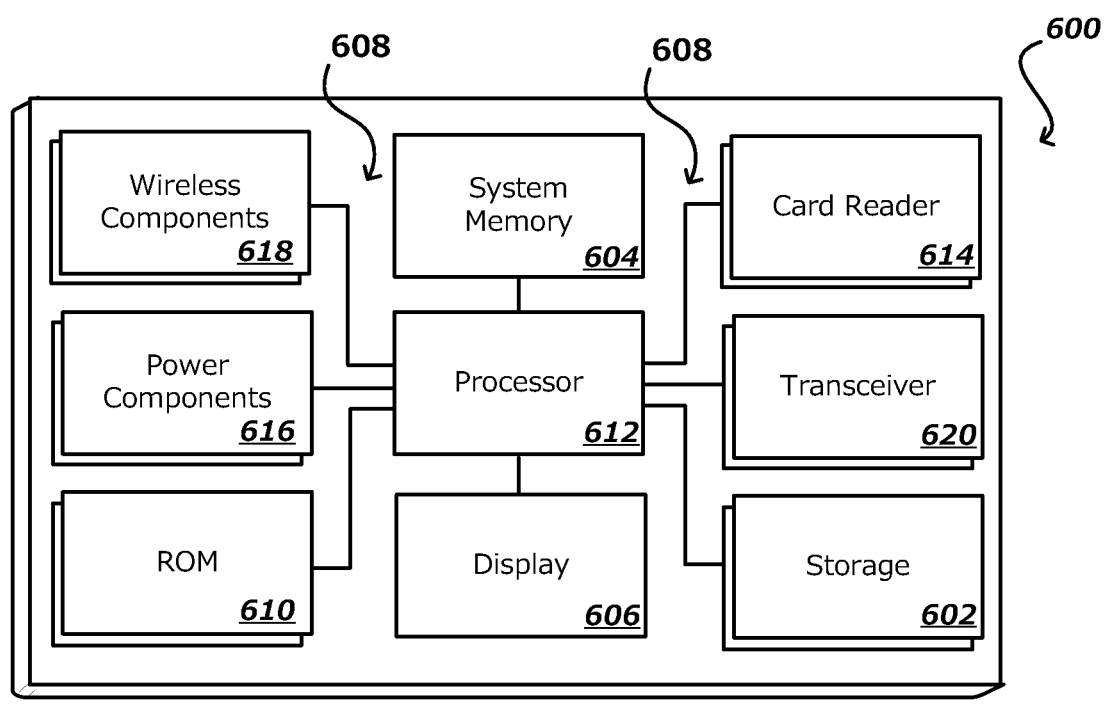
FIG. 6 illustrates an example set of basic components of a card reader device in accordance with various embodiments.

FIG. 6 illustrates an example set of basic components of a card reader device such as the device described with respect to FIG. 5. In this example, the device can include storage 602, system memory 604, display interface 606, system bus 608, memory 610, at least one processor 612, card reader circuitry 614, power components 616, wireless components 618, and transceiver 620. In some aspects, the system bus 608 collectively represents all system, peripheral, and chipset buses that communicatively connect the numerous internal devices of mobile card reader. For instance, system bus communicatively connects the processor(s) 612 with the various components.

The example device includes at least one processing unit 612 that can execute instructions that can be stored in a memory component or element 604. For example, in some implementations, the processor(s) 612 retrieve instructions to execute (and data to process) in order to execute the steps of the subject technology. The processor(s) 612 can include a microcontroller, or a single processor or a multi-core processor in different implementations. Additionally, the processor(s) can comprise one or more graphics processing units (GPUs) and/or one or more decoders (e.g., analog/digital converters), for example, to drive a display that may be coupled to a display interface. As would be apparent to one of ordinary skill in the art, the device can include many types of memory, data storage, or computer-readable media, such as a first data storage for program instructions for execution by the processing unit(s) 612, the same or separate storage can be used for data, a removable memory can be available for sharing information with other devices, and any number of communication approaches can be available for sharing with other devices.

System memory 604 can store static data and instructions needed by the processor(s) 612 and other modules of mobile card reader. Similarly, the processor(s) 612 can comprise one or more memory locations such as a CPU cache or processor in memory (PIM), etc. System memory 604 can include a read-and-write memory device. In some aspects, this device can be a non-volatile memory that stores instructions and data even when mobile card reader is without power. Some implementations of the subject disclosure can use a mass-storage device (such as solid state or magnetic devices) e.g., permanent storage device 602. Although the system memory can be either volatile or non-volatile, in some examples the system memory is a volatile read-and-write memory, such as a random access memory 610. System memory 604 can store some of the instructions and data that the processor needs at runtime, for example, to facilitate the process of mobile card reader activation, or payment processing, as discussed above. In some implementations, the processes of the subject disclosure are stored in system memory 604, storage device 602 and/or one or more memory locations embedded with the processor(s) 612. From these various memory units, processor(s) 612 retrieve instructions to execute and data to process in order to execute the processes of some implementations of the instant disclosure.

The bus 608 also connects to card reader circuitry 614 and a display interface. The input card reader circuitry 614 enables a user (e.g., a buyer or a merchant) to provide payment card information, for example via a payment card, to mobile card reader. Input devices used with card reader can include for example, alphanumeric keypads, such as input device; however, other input devices may also be used, including pointing devices (also called "cursor control devices") and/or wireless devices such as wireless keyboards, wireless pointing devices, etc. In this way, the device can include at least one additional input component able to receive conventional input from a user. This conventional input can include, for example, a push button, touch pad, touch screen, wheel, joystick, keyboard, mouse, keypad, or any other such component or element whereby a user can input a command to the device. These I/O components could even be connected by a wireless infrared or Bluetooth or other link as well in some embodiments. Some devices also can include a microphone or other audio capture element that accepts voice or other audio commands. For example, a device might not include any buttons at all, but might be controlled only through a combination of visual and audio commands, such that a user can control the device without having to be in contact with the device.

Bus 608 also communicatively couples the processor to one or more wireless components operable to communicate with one or more electronic devices within a communication range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections as known in the art.

Bus 608 also communicatively couples mobile card reader to a network (not shown) through transceiver 620. It should be understood that the transceiver 620 can be configured to send/receive radio frequency transmissions using a variety of messaging services. As discussed above, transceiver 620 can be configured to transact data using one or more of a MMS service, SMS service, or an email service. In this manner, mobile card reader can communicate with one or more computers or servers, such as that of a payment processing service or activation service for the mobile card reader. In practice the methods of the subject technology can be carried out by mobile card reader. In some aspects, instructions for performing one or more of the method steps of the present disclosure are stored on one or more memory devices such as the storage 602 and/or the system memory 604.

Bus 608 also communicatively couples the processor to a power system, such as may include a battery. The processor 612 can be configured to determine a charge level or health of the power source, e.g., battery, in accordance with various embodiments described herein. Various other elements and/or combinations are possible as well within the scope of various embodiments.

Figure 7:
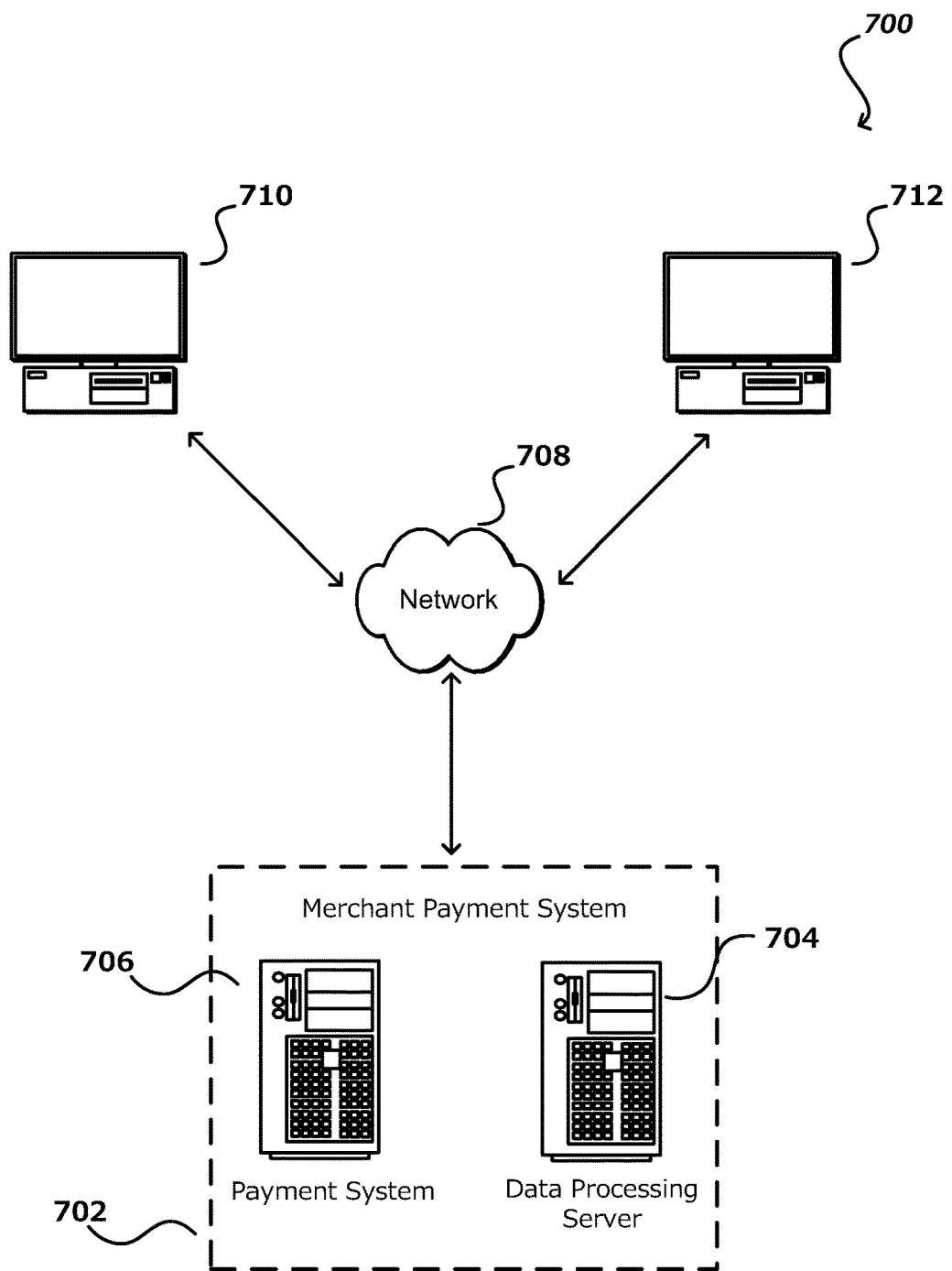
FIG. 7 illustrates an example environment for conducting a financial transaction at a point-of-sale system in accordance with various embodiments.

FIG. 7 illustrates an example environment for conducting a financial transaction at a point-of-sale system in accordance with various embodiments. In this example, the example environment 700 includes a merchant payment system 702 for processing transactions between a customer and a merchant. The merchant payment system includes, for example, a data processing server 704 and a payment server 706. The data processing server can be implemented as computer programs on one or more computers in one or more locations, in which the systems, components, and techniques described is this specification can be implemented. The operation of the payment server is described below. The example environment also includes computing devices, e.g., transaction registers or other point-of-sale systems, corresponding to the merchant 710 and 712.

As described, the point-of-sale systems 710 and 712 can include the reader and computing device, where the computing device can be coupled to or in communication with the merchant payment system through a data communication network 708, e.g., the Internet. These devices each generally include a memory, e.g., a random access memory (RAM), for storing instructions and data, and a processor for executing stored instructions. The devices and can each include one or more components, e.g., software or hardware, that are operable to send and receive requests, messages, or other types of information over the network. Some examples of computing devices include personal computers, cellular phones, handheld messaging devices, laptop computers, personal data assistants, tablet devices, and the like.

The network 708 can include any appropriate network, including an intranet, the Internet, a cellular network, a local area network, a wide area network, or any other such network, or combination thereof. Components used for such a system can depend at least in part upon the type of network, the environment selected, or both. Protocols and components for communicating over such a network are well known and will not be discussed herein in detail. The devices and the referral system can communicate over the network using wired or wireless connections, and combinations thereof.

Each of the computing devices is configured to send to the merchant payment system respective financial data that corresponds to a financial transaction that was processed by the computing device. The financial data can include, for example, data stored in a financial payment card, e.g., Track 1 data, receipt email addresses, and information describing a card-less payment account. Other examples of financial data that can be captured includes purchase data, e.g., an itemized listing of purchases, card mix data, geolocation data indicating a geographic location of a particular transaction, online/offline card data, data describing the merchant, e.g., merchant category codes (MCCs), and any type of data that is received upon a customer's authentication into a social network.

Figure 8:
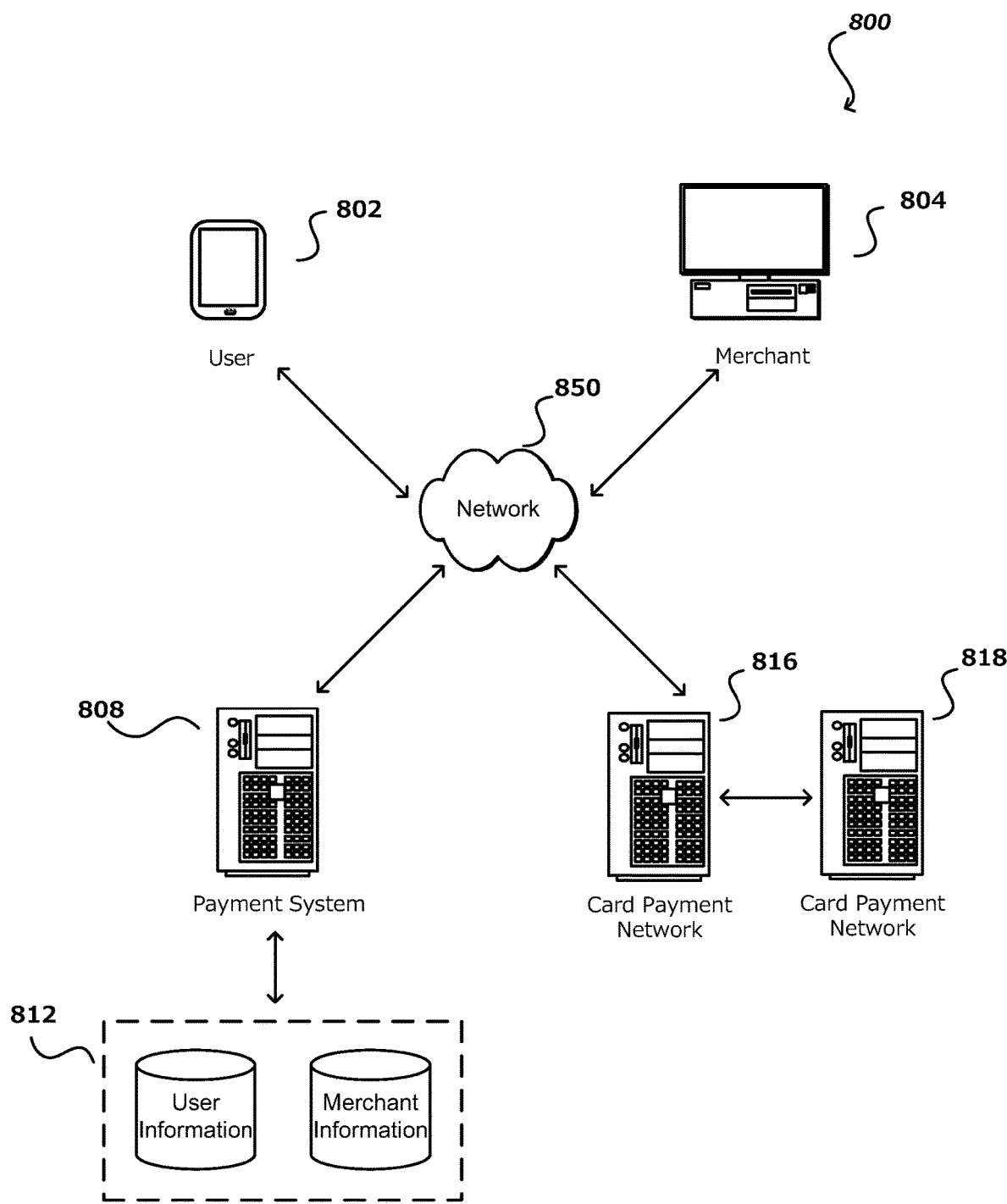
FIG. 8 illustrates an example of an environment for implementing a payment service network.

FIG. 8 illustrates an example of an environment 800 for implementing a payment service network. Although a mobile device environment is described for purposes of explanation, different environments may be used, e.g., a web-based environment, to implement various embodiments. The example environment includes a payment system 808, which can be implemented as computer programs on one or more computers in one or more locations, in which the systems, components, and techniques described below can be implemented. The example environment also includes a user device 802 and a merchant device 804.

The user device and the merchant device can each be a computer coupled to the payment system through a data communication network 850, e.g., the Internet. The user device and the merchant device each generally include a memory, e.g., a random access memory (RAM), for storing instructions and data, and a processor for executing stored instructions. The user device and the merchant device can each include one or more components, e.g., software or hardware, that are configured to respectively determine a geographic location of the user device or the merchant device, using, for example, various geolocation techniques, e.g., a global positioning system (GPS). Further, the user device and the merchant device can each be any appropriate device operable to send and receive requests, messages, or other types of information over the network. Some examples of user devices include personal computers, cellular phones, handheld messaging devices, laptop computers, personal data assistants, tablet devices, and the like.

The network can include any appropriate network, including an intranet, the Internet, a cellular network, a local area network, a wide area network, or any other such network, or combination thereof. Components used for such a system can depend at least in part upon the type of network, the environment selected, or both. Protocols and components for communicating over such a network are well known and will not be discussed herein in detail. The payment system, the merchant device, and the user device can communicate over the network using wired or wireless connections, and combinations thereof.

As used in this specification, a financial transaction is a transaction that is conducted between a customer and a merchant at a point-of-sale. When paying for a financial transaction, the customer can provide the merchant with cash, a check, or credit card for the amount that is due. The merchant can interact with a point-of-sale device, e.g., merchant device, to process the financial transaction. During financial transactions, the point-of-sale device can collect data describing the financial transaction, including, for example, the amount of payment received from customers.

In some implementations, the payment system is configured to accept card-less payment transactions from customers, e.g., the customer. As used in this specification, a card-less payment transaction is a transaction conducted between the customer and a merchant at the point-of-sale during which a financial account of the customer is charged without the customer having to physically present a financial payment card to the merchant at the point-of-sale. That is, the merchant need not receive any details about the financial account, e.g., the credit card issuer or credit card number, for the transaction to be processed.

Before conducting card-less payment transactions, the customer typically creates a user account with the payment system. The customer can create the user account, for example, by interacting with a user application that is configured to perform card-less payment transactions and that is running on the user device. When creating a user account with the payment system, the customer will provide information of the customer, data describing a financial account of the customer, e.g., credit card number, expiration date, and a billing address. This user information can be securely stored by the payment system, for example, in a user information database. To accept card-less payment transactions, the merchant typically creates a merchant account with the payment system by providing information describing the merchant including, for example, a merchant name, contact information, e.g., telephone numbers, the merchant's geographic location address, and one or more financial accounts to which funds collected from users will be deposited. This merchant information can be securely stored by the payment system, for example, in a merchant information database.

The payment system is configured to perform card-less payment transactions. The payment system can include one or more servers that are configured to securely perform electronic financial transactions, e.g., electronic payment transactions, between a customer and a merchant, for example, through data communicated between the user device and the merchant device. Generally, when a customer and a merchant enter into an electronic financial transaction, the transaction is processed by transferring funds from a financial account associated with the user account to a financial account associated with the merchant account.

The payment system is configured to send and receive data to and from the user device and the merchant device. For example, the payment system can be configured to send data describing merchants to the user device using, for example, the information stored in the merchant information data store 812. For example, the payment system can communicate data describing merchants that are within a threshold geographic distance from a geographic location of the user device, as described in this specification. The data describing merchants can include, for example, a merchant name, geographic location, contact information, and an electronic catalogue, e.g., a menu, that describes items that are available for purchase from the merchant.

In some embodiments, the payment system is configured to determine whether a geographic location of the user device is within a threshold geographic distance from a geographic location of the merchant device. The payment system can determine a geographic location of the user device using, for example, geolocation data provided by the user device. Similarly, the payment system can determine a geographic location of the merchant device using, for example, geolocation data provided by the merchant device or using a geographic address, e.g., street address, provided by the merchant. Depending on the implementation, the threshold geographic distance can be specified by the payment system or by the merchant.

Determining whether the user device 802 is within a threshold geographic distance of the merchant device can be accomplished in different ways including, for example, determining whether the user device is within a threshold geographic radius of the merchant device, determining whether the user device is within a particular geofence, or determining whether the user device can communicate with the merchant device using a specified wireless technology, e.g., Bluetooth or Bluetooth low energy (BLE). In some embodiments, the payment system restricts card-less payment transactions between the customer and the merchant to situations where the geographic location of the user device is within a threshold geographic distance from a geographic location of the merchant device.

The payment system can also be configured to communicate with a computer system 816 of a card payment network, e.g., Visa or MasterCard, over the network, or over a different network, for example, to conduct electronic financial transactions. The computer system of the card payment network can communicate with a computer system 818 of a card issuer, e.g., a bank. There may be computer systems of other entities, e.g., the card acquirer, between the payment system and the computer system of the card issuer.

The customer operating the user device that is within a threshold geographic distance of the merchant can interact with a user application running on the user device to conduct a card-less payment transaction with the merchant. While interacting with the user application, the customer can select the merchant, from a listing of merchants, with whom the customer wants to enter into a card-less payment transaction. The user can select the merchant, for example, by selecting a "check in" option associated with the merchant. The user device can communicate data to the payment system indicating that the customer has checked in with the merchant. In response, the payment system can communicate data to notify the merchant device that the user has checked in. A merchant application running on the merchant device can notify the merchant that the user has electronically checked in with the merchant through a display screen of the merchant device.

Once checked in, the customer can collect, or request, items that are available for purchase from the merchant. When the customer is ready to enter into the card-less payment transaction, the customer can, for example, approach a point-of-sale for the merchant and identify him or herself. For example, the customer can verbally notify the merchant that the customer wants to enter into a card-less payment transaction and can provide the merchant with the customer's name. The merchant can then interact with the merchant application to select the customer, from a listing of customers that have checked in with the merchant, to initiate a card-less payment transaction for the items being purchased by the customer. For example, the merchant can determine a total amount to bill the customer for the items being purchased. The customer can verbally approve the total amount to be billed and, in response, the merchant can submit a request for a card-less payment transaction for the total amount to the payment system. In response, the payment system can obtain, for example, from the user information database, data describing a financial account associated with a user account of the customer to which the total amount will be billed.

The payment system can then communicate with the computer system of a card payment network to complete an electronic financial transaction for the total amount to be billed to the customer's financial account. Once the electronic financial transaction is complete, the payment system can communicate data describing the card-less payment transaction to the user device, e.g., an electronic receipt, which can, for example, notify the customer of the total amount billed to the user for the card-less payment transaction with the particular merchant Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, flash memory (e.g., SD cards, mini-SD cards, micro-SD cards, etc.), magnetic and/or solid state hard drives, read-only and recordable Blu-Ray® discs, ultra density optical discs, any other optical or magnetic media. The computer-readable media can store a computer program executable by at least one processing unit, such as a microcontroller, and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium" and "computer readable media" are entirely restricted to tangible, physical objects that store information in a form readable by a computer. These terms exclude any wireless signals, wired download signals, and any other ephemeral signals.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of exemplary approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A method for determining battery health in a card reader, the method comprising:

causing, by a processor, a battery to be exposed to a first load by running the processor at a first clock rate to maintain the card reader at a first rate of power consumption;

measuring, using an analog input pin of the processor, a first voltage across the battery in response to exposure of the battery to the first load;

causing, by the processor, the battery to be exposed to a second load by running the processor at a second clock rate that is different from the first clock rate to maintain the card reader at a second rate of power consumption that is different from the first rate of power consumption, wherein exposing the battery to the first load and exposing the battery to the second load are performed also based on switching an element between an activated state and a deactivated state, wherein the element includes at least one of a component of the card reader, a light emitting diode (LED) of the card reader, or a peripheral of the processor;

measuring, using the analog input pin of the processor, a second voltage across the battery in response to exposure of the battery to the second load;

determining an internal resistance of the battery via one or more calculations in which values are used in one or more equations, the values including the first rate of power consumption, the first voltage, the second rate of power consumption, and the second voltage;
generating an indicator of a health of the battery based on the internal resistance; and
outputting, by the card reader, the indicator of the health of the battery.

2. The method of claim 1, wherein causing, by the processor, the battery to be exposed the first load by running the processor at the first clock rate to maintain the card reader at the first rate of power consumption further comprises:
executing instructions by the processor at the first clock rate, the instructions stored in one or more non-transitory computer-readable media, wherein execution of the instructions by the processor at the first clock rate causes the processor to maintain the battery at the first rate of power consumption.

3. The method of claim 2, wherein causing, by the processor, the battery to be exposed to the second load by running the processor at the second clock rate that is different from the first clock rate to maintain the card reader at the second rate of power consumption further comprises:
executing the instructions by the processor at the second clock rate, wherein execution of the instructions by the processor at the second clock rate causes the processor to maintain the battery at the second rate of power consumption.

4. The method of claim 3, further comprising:
determining that the battery is at least one of: fully charged, charged to a threshold amount, or charged for a threshold amount of time.

5. The method of claim 1, further comprising:
prior to exposing the battery to the first load, disabling an interrupt system configured to manage interrupts for the processor.

6. The method of claim 1, further comprising:
prior to exposing the battery to the first load, determining, by the processor, that the battery has completed a charge cycle.

7. The method of claim 1, wherein causing the battery to be exposed to the first load is triggered in response to determining that the card reader has been disconnected from a charger configured to charge the battery.

8. The method of claim 1, wherein the battery is a rechargeable battery corresponding to at least one of a lead-acid battery, a nickel cadmium battery (NiCd), a nickel metal hydride (NiMH) battery, a lithium ion (Li-ion) battery, or a lithium ion polymer (Li-ion polymer) battery.

9. The method of claim 1, further comprising:
causing, by the processor, the battery to be exposed to the first load to maintain the card reader at the first rate of consumption;
measuring a third voltage across the battery;
causing, by the processor, the battery to be exposed to the second load to maintain the card reader at the second rate of consumption;
measuring a fourth voltage across the battery;
determining a first average voltage based at least in part on the first voltage and the third voltage;
determining a second average voltage based at least in part on the second voltage and the fourth voltage; and
determining the internal resistance of the battery based at least in part on the first rate of consumption, the first average voltage, the second rate of consumption, and the second average voltage.

10. The method of claim 1, wherein outputting the indicator of the health of the battery includes displaying a message on a display interface.

11. The method of claim 1, wherein generating the indicator of the health of the battery based on the internal resistance includes modeling a discharge curve of the battery.

12. The method of claim 1, wherein outputting the indicator of the health of the battery includes activating at least one light emitting diode (LED) of the card reader.

13. The method of claim 1, wherein outputting the indicator of the health of the battery includes displaying a message on a display interface of a computing device to which card reader is coupled.

14. A device, comprising:
a battery configured to provide power to a processor;
an output interface that outputs an indicator of a health of the battery; and
the processor configured to:
cause the battery to be exposed to a first load by running the processor at a first clock rate to maintain the device at a first rate of power consumption,
measure a first voltage across the battery using an analog input pin of the processor in response to exposure of the battery to the first load,
cause the battery to be exposed to a second load by running the processor at a second clock rate that is different from the first clock rate to maintain the device at a second rate of power consumption that is different from the first rate of power consumption, wherein exposing the battery to the first load and exposing the battery to the second load are also based at least in part on switching an element between an activated state and a deactivated state, wherein the element includes at least one of a component of the device, a light emitting diode (LED) of the device, or a peripheral of the processor,
measure a second voltage across the battery using the analog input pin of the processor in response to exposure of the battery to the second load,
determine an internal resistance of the battery via one or more calculations in which values are used in one or more equations, the values including the first rate of power consumption, the first voltage, the second rate of power consumption, and the second voltage, and
generate the indicator of the health of the battery based on the internal resistance.

15. The device of claim 14, wherein the processor is further configured to disable an interrupt system prior to exposing the battery to the first load, further comprising:
the interrupt system, wherein the interrupt system is configured to manage interrupts for the processor.

16. The device of claim 14, wherein the processor is further configured to:
cause the battery to be exposed to the first load to maintain the device at the first rate of consumption;
measure a third voltage across the battery;
cause the battery to be exposed to the second load to maintain the device at the second rate of consumption;
measure a fourth voltage across the battery;
determine a first average voltage based at least in part on the first voltage and the third voltage;
determine a second average voltage based at least in part on the second voltage and the fourth voltage; and
determine the internal resistance of the battery based at least in part on the first rate of consumption, the first average voltage, the second rate of consumption, and the second average voltage.

17. The device of claim 14, further including:

a housing having a reader for reading a financial transaction card to facilitate a financial transaction between a buyer and seller; and an output adapted to be coupled into a portable computing device for providing a signal indicative of data that is transferable from the device to the portable computing device.

* * * * *